(12) United States Patent
Kamibayashi et al.

(10) Patent No.: US 12,189,294 B2
(45) Date of Patent: Jan. 7, 2025

(54) RESIST UNDERLAYER FILM-FORMING COMPOSITION HAVING DIOL STRUCTURE

(71) Applicant: NISSAN CHEMICAL CORPORATION, Tokyo (JP)

(72) Inventors: Satoshi Kamibayashi, Toyama (JP); Yuki Endo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 128 days.

(21) Appl. No.: 17/928,534

(22) PCT Filed: Jun. 11, 2021

(86) PCT No.: PCT/JP2021/022278
§ 371 (c)(1),
(2) Date: Nov. 29, 2022

(87) PCT Pub. No.: WO2021/251482
PCT Pub. Date: Dec. 16, 2021

(65) Prior Publication Data
US 2023/0205086 A1  Jun. 29, 2023

(30) Foreign Application Priority Data

Jun. 12, 2020 (JP) .................. 2020-102046

(51) Int. Cl.
*G03F 7/11* (2006.01)
*H01L 21/027* (2006.01)

(52) U.S. Cl.
CPC ............ *G03F 7/11* (2013.01); *H01L 21/0274* (2013.01)

(58) Field of Classification Search
CPC ........ G03F 7/11; G03F 7/094; H01L 21/0274; H01L 21/02282; H01L 21/02118;
(Continued)

(56) References Cited

U.S. PATENT DOCUMENTS 10,429,739 B2 * 10/2019 Kori ...................... G03F 7/094
2004/0110089 A1   6/2004 Neef et al.
(Continued)

FOREIGN PATENT DOCUMENTS

JP   2006-502448 A   1/2006
JP   2010-237491 A   10/2010
(Continued)

OTHER PUBLICATIONS

Dec. 13, 2022 International Preliminary Report on Patentability issued in International Patent Application No. PCT/JP2021/022278.
(Continued)

*Primary Examiner* — Su C Kim
(74) *Attorney, Agent, or Firm* — Oliff PLC

(57) ABSTRACT

A composition contains an organic solvent and compound (formula (1)), theoretical molecular weight 999 or less. (Z1 contains a nitrogen-containing heterocyclic ring; U represents a monovalent organic group (formula (2)); and p represents 2 to 4.) (In formula (2), R1 represents an alkylene group having 1 to 4 carbon atoms; A1 to A3 represent a hydrogen atom, or methyl or ethyl group: X represents —COO—, —OCO—, —O—, —S— or —NRa—; Ra represents a hydrogen atom or methyl group; Y represents a direct bond or optionally substituted alkylene group having 1 to 4 carbon atoms; R2, R3 and R4 represent a hydrogen atom or optionally substituted alkyl group having 1 to 10 carbon atoms or aryl group having 6 to 40 carbon atoms; R5 represents a hydrogen atom or hydroxy group; n represents 0 or 1; m1 and m2 represent 0 or 1; and * represents a binding site to Z1.)

15 Claims, 1 Drawing Sheet

(58) Field of Classification Search
CPC ........... H01L 21/02205; H01L 21/0273; H01L 21/0332; H01L 21/0337; H01L 21/30604; H01L 21/3081; H01L 21/3086; H01L 21/31144; H01L 21/32139; C08F 220/20; C08G 65/34
See application file for complete search history.

(56) References Cited

U.S. PATENT DOCUMENTS

| | | | |
|---|---|---|---|
| 2010/0092894 A1* | 4/2010 | Liu | G03F 7/091 |
| | | | 106/287.21 |
| 2011/0059404 A1* | 3/2011 | Sakamoto | C08G 63/42 |
| | | | 252/582 |
| 2015/0316850 A1 | 11/2015 | Someya et al. | |
| 2016/0238936 A1 | 8/2016 | Nishita et al. | |
| 2016/0336189 A1* | 11/2016 | Kori | H01L 21/31058 |
| 2017/0045820 A1 | 2/2017 | Sakaida et al. | |
| 2018/0011405 A1* | 1/2018 | Watanabe | G03F 7/0752 |
| 2018/0095367 A1* | 4/2018 | Ryu | H01L 21/0276 |
| 2019/0086806 A1* | 3/2019 | Usui | G03F 7/11 |
| 2020/0319561 A1 | 10/2020 | Endo et al. | |
| 2021/0063881 A1 | 3/2021 | Endo et al. | |

FOREIGN PATENT DOCUMENTS

| | | |
|---|---|---|
| KR | 10-2015-0095693 A | 8/2015 |
| WO | 2015/046149 A1 | 4/2015 |
| WO | 2015/163195 A1 | 10/2015 |
| WO | 2019/124474 A1 | 6/2019 |
| WO | 2019/151471 A1 | 8/2019 |

OTHER PUBLICATIONS

Sep. 7, 2021 Search Report issued in International Patent Application No. PCT/JP2021/022278.
Mar. 19, 2024 Decision to Grant issued in Korean Patent Application No. 10-2022-7045540.

* cited by examiner

EMBEDDED SUBSTRATE

EXAMPLE OF DEFECTIVE　　　EXAMPLE 2
EMBEDDING

RESIST UNDERLAYER FILM-FORMING COMPOSITION HAVING DIOL STRUCTURE

TECHNICAL FIELD

The present invention relates to a resist underlayer film-forming composition that is superior in embeddability in a microstructural substrate and occurs a reduced amount of sublimate during film formation in a lithography process in manufacturing a semiconductor. In addition, the present invention relates to a method for manufacturing a substrate with a resist pattern by applying the resist underlayer film, and a method for manufacturing a semiconductor device. In addition, the present invention relates to a protective film for processing a substrate with a wet etching chemical solution during manufacturing of a semiconductor.

BACKGROUND ART

In manufacturing a semiconductor, a lithography process for forming a resist pattern having a desired shape by providing a resist underlayer film between a substrate and a resist film formed on the substrate has widely been known. Patent Literature 1 discloses a resist underlayer film-forming composition containing a reaction product of a compound containing a triazine skeleton having three epoxy groups, a dicarboxylic acid compound containing a disulfide bond, or the like.

In addition, when a resist underlayer film is formed using the resist underlayer film-forming composition in a lithography process in manufacturing a semiconductor, generation of a sublimation component (sublimate) derived from the polymer resin, and a low-molecular compound such as a crosslinking agent or a crosslinking catalyst during baking has become a new problem. A concern in a semiconductor device manufacturing process is that contamination of the inside of a film-forming apparatus by adhesion and accumulation of such a sublimate transfers to a wafer as a foreign substance, which would be a cause of generation of defects and the like. Therefore, there is a demand for a novel underlayer film composition that suppresses generation of such a sublimate from a resist underlayer film as much as possible, and studies on a resist underlayer film exhibiting low sublimation properties have been conducted in Patent Literature 2 and the like.

In addition, Patent Literature 3 discloses a protective film-forming composition against a semiconductor wet etching solution, the protective film-forming composition containing a solvent and a compound containing at least one pair of two hydroxy groups adjacent to each other in a molecule or a polymer thereof.

CITATION LIST

Patent Literature

Patent Literature 1: WO 2019/151471 A
Patent Literature 2: JP 2010-237491 A
Patent Literature 3: WO 2019/124474 A

SUMMARY OF INVENTION

Technical Problem

The conventional resist underlayer film-forming compositions have been required to be embedded in a fine pattern (for example, a width of 10 nm or less) on a semiconductor substrate, which is increasingly miniaturized, without voids, while appropriately controlling the optical constants of the film itself, as well as to provide a solution to prevent any trouble (shape defect or the like) during formation of a resist pattern, which is a requirement for a resist underlayer film; however, it has been difficult for the conventional resist underlayer film-forming compositions to satisfy both of these capacities.

Moreover, sublimate generated at the time of baking during the formation of the resist underlayer film would also cause apparatus contamination and voids, and thus reduction of the sublimate is further required. Furthermore, because substrate processing may be performed with a wet etching chemical solution (for example, SC-1 (an ammonia-hydrogen peroxide solution) or the like) in the semiconductor manufacturing process, the resist underlayer film may be required to have a function as a protective film for a non-processed portion.

An object of the present invention is to solve the above problems.

Solution to Problem

The present invention encompasses the followings.

[1] A resist underlayer film-forming composition comprising:
a compound represented by the following Formula (1) and having a theoretical molecular weight of 999 or less; and
an organic solvent:

[Chem. 1]

Formula (1)

in Formula (1), $Z_1$ contains a nitrogen-containing heterocyclic ring; U is a monovalent organic group represented by the following Formula (2); and p represents an integer of 2 to 4,

[Chem. 2]

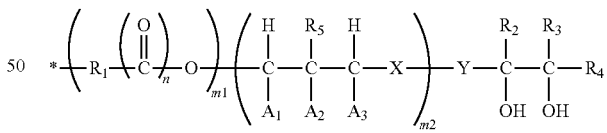

Formula (2)

in Formula (2), $R_1$ represents an alkylene group having 1 to 4 carbon atoms; $A_1$ to $A_3$ each independently represent a hydrogen atom, a methyl group, or an ethyl group; X represents any of —COO—, —OCO—, —O—, —S—, or $NR_a$—, $R_a$ represents a hydrogen atom or a methyl group; Y represents a direct bond or an alkylene group having 1 to 4 carbon atoms which may be substituted; $R_2$, $R_3$, and $R_4$ are each independently a hydrogen atom, or an alkyl group having 1 to 10 carbon atoms which may be substituted or an aryl group having 6 to 40 carbon atoms which may be substituted; $R_5$ is a hydrogen atom or a hydroxy group; n represents an integer of 0 or 1; m1 and m2 each independently represent an integer of 0 or 1; and * represents a binding site to $Z_1$.

[2] The resist underlayer film-forming composition according to [1], wherein $Z_1$ is represented by the following Formula (3):

[Chem. 3]

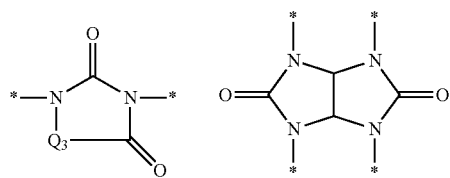

Formula (3)

in Formula (3), $Q_3$ represents the following Formula (4), Formula (5), or Formula (6):

[Chem. 4]

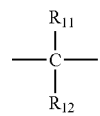

Formula (4)

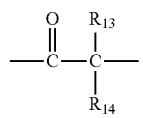

Formula (5)

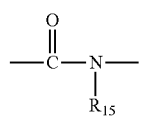

Formula (6)

in Formula (4), Formula (5), and Formula (6),
$R_{11}$, $R_{12}$, $R_{13}$, and $R_{14}$ each independently represent a hydrogen atom, an alkyl group having 1 to 10 carbon atoms which may be interrupted by an oxygen atom or a sulfur atom, an alkenyl group having 2 to 10 carbon atoms which may be interrupted by an oxygen atom or a sulfur atom, an alkynyl group having 2 to 10 carbon atoms which may be interrupted by an oxygen atom or a sulfur atom, a benzyl group, or a phenyl group, in which the phenyl group may be substituted with at least one monovalent functional group selected from the group consisting of an alkyl group having 1 to 6 carbon atoms, a halogen atom, an alkoxy group having 1 to 10 atoms, a nitro group, a cyano group, and an alkylthio group having 1 to 6 carbon atoms, $R_{15}$ represents a hydrogen atom, an alkyl group having 1 to 10 carbon atoms which may be interrupted by an oxygen atom or a sulfur atom and may be substituted with a hydroxy group, an alkenyl group having 3 to 10 carbon atoms which may be interrupted by an oxygen atom or a sulfur atom, an alkynyl group having 3 to 10 carbon atoms which may be interrupted by an oxygen atom or a sulfur atom, a benzyl group, or a phenyl group, in which the phenyl group may be substituted with at least one monovalent functional group selected from the group consisting of an alkyl group having 1 to 6 carbon atoms, a halogen atom, an alkoxy group having 1 to 10 carbon atoms, a nitro group, a cyano group, an alkylthio group having 1 to 6 carbon atoms, and a monovalent organic group represented by U in Formula (1); and * represents a binding site to U.

[3] The resist underlayer film-forming composition according to [2], wherein $R_{15}$ is an alkyl group having 1 to 10 carbon atoms or the monovalent organic group represented by U in Formula (1).

[4] The resist underlayer film-forming composition according to [2] or [3], wherein $R_{11}$ and $R_{12}$ are each independently an alkyl group having 1 to 10 carbon atoms.

[5] The resist underlayer film-forming composition according to any one of [1] to [4], wherein X is —S—, and Y is a methylene group.

[6] The resist underlayer film-forming composition according to [1], further comprising an acid compound.

[7] The resist underlayer film-forming composition according to any one of [1] to [6], further comprising a surfactant.

[8] A resist underlayer film, which is a baked product of a coating film of the resist underlayer film-forming composition according to any one of [1] to [7].

[9] A protective film-forming composition against a semiconductor wet etching solution comprising:
    a compound represented by the following Formula (1), having a theoretical molecular weight of 999 or less, and containing two or more nitrogen atoms and six or more oxygen atoms in a molecule; and
    an organic solvent:

[Chem. 5]

Formula (1)

in Formula (1), $Z_1$ contains a nitrogen-containing heterocyclic ring; U is a monovalent organic group represented by the following Formula (2); and p represents an integer of 2 to 4,

[Chem. 6]

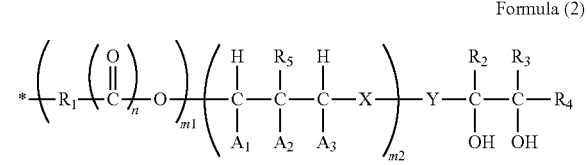

Formula (2)

in Formula (2), $R_1$ represents an alkylene group having 1 to 4 carbon atoms; $A_1$ to $A_3$ each independently represent a hydrogen atom, a methyl group, or an ethyl group; X represents any of —COO—, —OCO—, —O—, —S—, or $NR_a$—, $R_a$ represents a hydrogen atom or a methyl group; Y represents a direct bond or an alkylene group having 1 to 4 carbon atoms which may be substituted; $R_2$, $R_3$, and $R_4$ are each independently a hydrogen atom, or an alkyl group having 1 to 10 carbon atoms which may be substituted or an aryl group having 6 to 40 carbon atoms which may be substituted; $R_5$ is a hydrogen atom or a hydroxy group; n represents an integer of 0 or 1; m1 and m2 each independently represent an integer of 0 or 1; and * represents a binding site to $Z_1$.

The composition according to [9], wherein $Z_1$ is represented by the following Formula (3):

[Chem. 7]

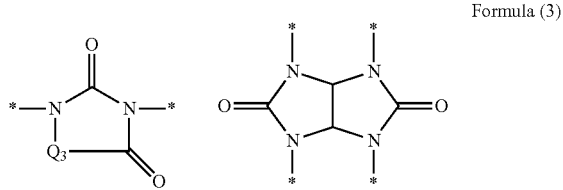

Formula (3)

in Formula (3), $Q_3$ represents the following Formula (4), Formula (5), or Formula (6):

[Chem. 8]

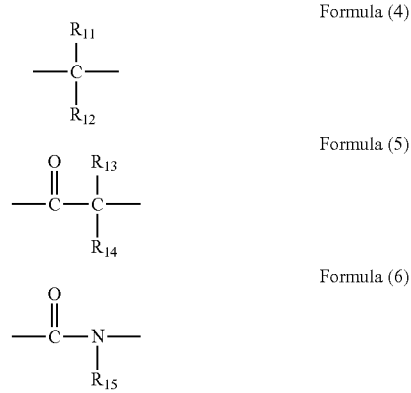

Formula (4)

Formula (5)

Formula (6)

in Formula (4), Formula (5), and Formula (6), $R_{11}$, $R_{12}$, $R_{13}$, and $R_{14}$ each independently represent a hydrogen atom, an alkyl group having 1 to 10 carbon atoms which may be interrupted by an oxygen atom or a sulfur atom, an alkenyl group having 2 to 10 carbon atoms which may be interrupted by an oxygen atom or a sulfur atom, an alkynyl group having 2 to 10 carbon atoms which may be interrupted by an oxygen atom or a sulfur atom, a benzyl group, or a phenyl group, in which the phenyl group may be substituted with at least one monovalent functional group selected from the group consisting of an alkyl group having 1 to 6 carbon atoms, a halogen atom, an alkoxy group having 1 to 10 atoms, a nitro group, a cyano group, and an alkylthio group having 1 to 6 carbon atoms, $R_{15}$ represents a hydrogen atom, an alkyl group having 1 to 10 carbon atoms which may be interrupted by an oxygen atom or a sulfur atom and may be substituted with a hydroxy group, an alkenyl group having 3 to 10 carbon atoms which may be interrupted by an oxygen atom or a sulfur atom, an alkynyl group having 3 to 10 carbon atoms which may be interrupted by an oxygen atom or a sulfur atom, a benzyl group, or a phenyl group, in which the phenyl group may be substituted with at least one monovalent functional group selected from the group consisting of an alkyl group having 1 to 6 carbon atoms, a halogen atom, an alkoxy group having 1 to 10 carbon atoms, a nitro group, a cyano group, an alkylthio group having 1 to 6 carbon atoms, and a monovalent organic group represented by U in Formula (1); and * represents a binding site to U.

[11] The protective film-forming composition according to [9] or [10], further comprising an acid compound and/or a crosslinking agent.

[12] A protective film, which is a baked product of a coating film of the protective film-forming composition according to any one of [9] to [11].

A method for manufacturing a substrate with a resist pattern, comprising the steps of:
applying a resist underlayer film-forming composition according to any one of [1] to [7] onto a semiconductor substrate and baking the applied composition to form a resist underlayer film; and
forming a resist film on the resist underlayer film and then performing exposure and development to form a resist pattern,
wherein the method is used for manufacturing a semiconductor.

[14] A method for manufacturing a semiconductor device, comprising the steps of:
forming a resist underlayer film using a resist underlayer film-forming composition according to any one of [1] to [7] on a semiconductor substrate optionally carrying an inorganic film formed on a surface thereof;
dry etching the resist underlayer film using the resist pattern as a mask to expose a surface of the inorganic film or semiconductor substrate; and
etching the inorganic film or semiconductor substrate using the dry-etched resist underlayer film as a mask.

[15] A method for manufacturing a semiconductor device, comprising the steps of:
forming a protective film using a protective film-forming composition according to any one of [9] to [11] on a semiconductor substrate optionally carrying an inorganic film formed on a surface thereof;
forming a resist pattern on the protective film;
dry etching the protective film using the resist pattern as a mask to expose a surface of the inorganic film or semiconductor substrate; and
wet etching and washing the inorganic film or semiconductor substrate using a semiconductor wet etching solution using the dry-etched protective film as a mask.

Advantageous Effects of Invention

The resist underlayer film-forming composition of the present invention can be embedded in a fine pattern (for example, a width of 10 nm or less) formed on a semiconductor substrate, which is increasingly miniaturized, without voids, while providing a solution to prevent any trouble (a shape defect or the like) at the time of forming a resist pattern, which is a requirement for a resist underlayer film. Moreover, it generates a smaller amount of the sublimate generated at the time of baking during the formation of the resist underlayer film than the conventional resist underlayer films.

Furthermore, in the semiconductor manufacturing process, the resist underlayer film and protective film according to the invention are resistant to a wet etching chemical solution for processing a substrate. Furthermore, because the films according to the invention provide a higher dry etching rate than the conventional wet etching protective films, they permits reduction of damage to the substrate at the time of their removal.

It is believed that larger the molecular weight of a polymer, larger the molecular size and viscosity, so that the polymer would make it difficult for a composition containing the polymer to be embedded in a fine pattern. In the circumstances, since the resist underlayer film-forming composition of the present invention uses a compound having a theoretical molecular weight of 999 or less, it can be embedded in a fine structure as compared with a composition using a polymer with a higher molecular weight. Moreover, the fact that the compound contains a large number of hydroxy groups permit increasing of the boiling point of the compound to suppress its sublimation, and improving the adhesive force thereof through an interaction with a part of the substrate. As the result, it imparts a resistance to a wet etching chemical solution treatment.

DESCRIPTION OF EMBODIMENTS

<Resist Underlayer Film-Forming Composition>

Figure 1:
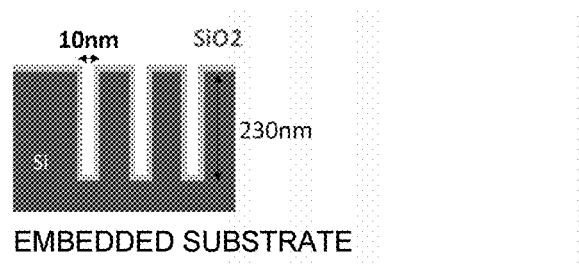
FIG. 1 is a schematic cross-sectional view of a substrate for evaluating embeddability of Example.

A resist underlayer film-forming composition according to the present invention contains: a compound represented by the following Formula (1) and having a theoretical molecular weight of 999 or less; and an organic solvent.

The theoretical molecular weight refers to a molecular weight obtained by calculation based on the chemical structure of the compound represented by Formula (1).

From the viewpoint of increasing the dry etching rate, it is preferable that the compound contains 2 or more, 3 or more, or 4 or more nitrogen atoms and 6 or more, 8 or more, 9 or more, 10 or more, or 15 or more oxygen atoms in the molecule. Moreover, it is preferable that the compound contains 2 or more, 3 or more, 4 or more, 5 or more, or 6 or more sulfur atoms in the molecule.

<Compound Represented by Formula (1) and Having Theoretical Molecular Weight of 999 or Less>

The compound contained in the resist underlayer film-forming composition of the present application and having a theoretical molecular weight of 999 or less is represented by the following Formula (1):

[Chem. 9]

Formula (1)

in Formula (1), $Z_1$ contains a nitrogen-containing heterocyclic ring; U is a monovalent organic group represented by the following Formula (2); and p represents an integer of 2 to 4,

[Chem. 10]

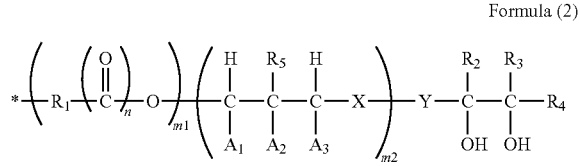

Formula (2)

in Formula (2), $R_1$ represents an alkylene group having 1 to 4 carbon atoms; $A_1$ to $A_3$ each independently represent a hydrogen atom, a methyl group, or an ethyl group; X represents any of —COO—, —OCO—, —O—, —S—, or $NR_a$—, $R_a$ represents a hydrogen atom or a methyl group; Y represents a direct bond or an alkylene group having 1 to 4 carbon atoms which may be substituted; $R_2$, $R_3$, and $R_4$ are each independently a hydrogen atom, or an alkyl group having 1 to 10 carbon atoms which may be substituted or an aryl group having 6 to 40 carbon atoms which may be substituted; $R_5$ is a hydrogen atom or a hydroxy group; n represents an integer of 0 or 1; m1 and m2 each independently represent an integer of 0 or 1; and * represents a binding site to $Z_1$.

m2 is preferably 1, and m1 is preferably 1.

It is most preferable that m1 is 0 when m2 is 1.

In Formula (1), $Z_1$ is preferably represented by the following Formula (3).

[Chem. 11]

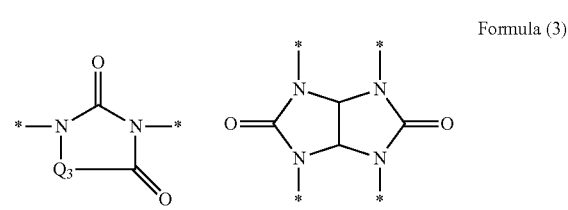

Formula (3)

In Formula (3), $Q_3$ represents the following Formula (4), Formula (5), or Formula (6):

[Chem. 12]

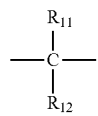

Formula (4)

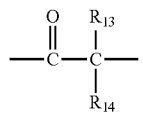

Formula (5)

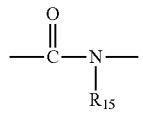

Formula (6)

In Formula (4), Formula (5), and Formula (6), $R_{11}$, $R_{12}$, $R_{13}$, and $R_{14}$ each independently represent a hydrogen atom, an alkyl group having 1 to 10 carbon atoms which may be interrupted by an oxygen atom or a sulfur atom, an alkenyl group having 2 to 10 carbon atoms which may be interrupted by an oxygen atom or a sulfur atom, an alkynyl group having 2 to 10 carbon atoms which may be interrupted by an oxygen atom or a sulfur atom, a benzyl group, or a phenyl group, in which the phenyl group may be substituted with at least one monovalent functional group selected from the group consisting of an alkyl group having 1 to 6 carbon atoms, a halogen atom, an alkoxy group having 1 to 10 atoms, a nitro group, a cyano group, and an alkylthio group having 1 to 6 carbon atoms.

Examples of the alkyl group include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, a 2-ethyl-3-methyl-cyclopropyl group, and a decyl group.

Examples of the alkenyl group include a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

Examples of the alkynyl group include an ethynyl group, a 1-propynyl group, a 2-propynyl group, a 1-butynyl group, a 2-butynyl group, and a 3-butynyl group.

The phenyl group may be substituted with at least one monovalent functional group selected from the group consisting of an alkyl group having 1 to 6 carbon atoms, a halogen atom, an alkoxy group having 1 to 10 atoms, a nitro group, a cyano group, and an alkylthio group having 1 to 6 carbon atoms.

The alkyl group is as exemplified above.

Examples of the halogen atom include a fluorine atom, a chlorine atom, a bromine atom, and an iodine atom.

Examples of the alkoxy group include a methoxy group, an ethoxy group, an n-propoxy group, an i-propoxy group, an n-butoxy group, an i-butoxy group, an s-butoxy group, a t-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, a 1-ethyl-2-methyl-n-propoxy group, an n-heptyloxy group, an n-octyloxy group, and an n-nonyloxy group.

Examples of the alkylthio group include a methylthio group, an ethylthio group, and a butylthio group.

In Formula (3), when $Q_3$ represents Formula (4), it is preferable that $R_{11}$ and $R_{12}$ in Formula (4) are each independently an alkyl group having 1 to 10 carbon atoms.

In Formula (3), when $Q_3$ represents Formula (5), it is preferable that $R_{13}$ and $R_{14}$ in Formula (5) are each independently an alkyl group having 1 to 10 carbon atoms.

In Formula (3), when $Q_3$ represents Formula (6), $R_{15}$ in Formula (6) represents a hydrogen atom, an alkyl group having 1 to 10 carbon atoms which may be interrupted by an oxygen atom or a sulfur atom and may be substituted with a hydroxy group, an alkenyl group having 3 to 10 carbon atoms which may be interrupted by an oxygen atom or a sulfur atom, an alkynyl group having 3 to 10 carbon atoms which may be interrupted by an oxygen atom or a sulfur atom, a benzyl group, or a phenyl group, in which the phenyl group may be substituted with at least one monovalent functional group selected from the group consisting of an alkyl group having 1 to 6 carbon atoms, a halogen atom, an alkoxy group having 1 to 10 carbon atoms, a nitro group, a cyano group, an alkylthio group having 1 to 6 carbon atoms, and a monovalent organic group represented by U in Formula (1).

The alkyl group, the alkenyl group, the alkynyl group, the halogen atom, the alkoxy group, and the alkylthio group are as exemplified above.

Preferably, $R_{15}$ is an alkyl group having 1 to 10 carbon atoms or a monovalent organic group represented by U in Formula (1), and p represents an integer of 2 to 4.

[Chem. 13]

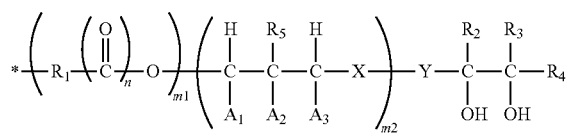

Formula (2)

In Formula (2), $R_1$ represents an alkylene group having 1 to 4 carbon atoms.

Examples of the alkylene group include a methylene group, an ethylene group, an n-propylene group, an isopropylene group, a cyclopropylene group, an n-butylene group, an isobutylene group, an s-butylene group, a t-butylene group, a cyclobutylene group, a 1-methyl-cyclopropylene group, and a 2-methyl-cyclopropylene group.

$A_1$ to $A_3$ each independently represent a hydrogen atom, a methyl group, or an ethyl group, and X represents any of —COO—, —OCO—, —O—, —S—, or —NR$_1$—. When X represents NR$_a$—, R$_a$ represents a hydrogen atom or a methyl group. Preferably, X is —S—.

In Formula (2), Y represents a direct bond or an alkylene group having 1 to 4 carbon atoms which may be substituted. The alkylene group is as exemplified above, and Y is preferably a methylene group.

Each of $R_2$, $R_3$, and $R_4$ is a hydrogen atom, or an alkyl group having 1 to 10 carbon atoms which may be substituted or an aryl group having 6 to 40 carbon atoms which may be substituted.

The expression "which may be substituted with a substituent" means that some or all hydrogen atoms present in the functional group to be substituted may be substituted with, for example, a hydroxy group, a halogen atom, a carboxyl group, a nitro group, a cyano group, a methylenedioxy group, an acetoxy group, a methylthio group, an amino group, or an alkoxy group having 1 to 9 carbon atoms. $R_5$ is a hydrogen atom or a hydroxy group.

Examples of the aryl group include a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

m1 and m2 each independently represent an integer of 0 or 1, m2 is preferably 1, and m1 is preferably 1.

It is most preferable that m1 is 0 when m2 is 1.

The compound represented by Formula (1) of the present application may be obtained, for example, by reacting an epoxy group or an allyl group of the compound represented by any one of the following Formulas (a) to (ak) with 1-thioglycerol (3-mercapto-1,2-propanediol, CAS No. 96-27-5) by a known method, but is not limited thereto. Moreover, the composition may have a diol structure by hydrolysis of the epoxy group of the compound. A diol structure derived from the reaction of the epoxy group or the allyl group with 1-thioglycerol is preferable, and a diol structure derived from the reaction of the epoxy group with 1-thioglycerol is more preferable.

[Chem. 14]

(a)

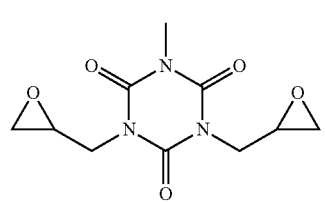

(b)

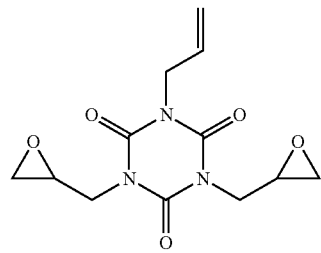

(c)

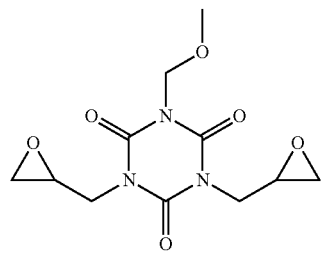

(d)

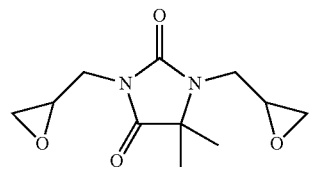

-continued
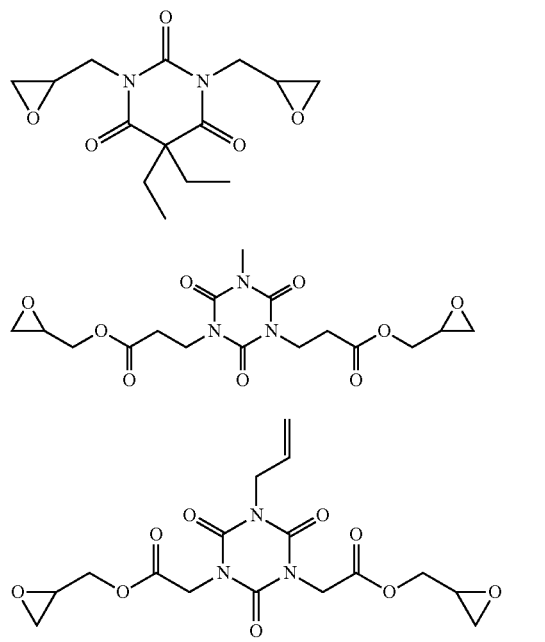
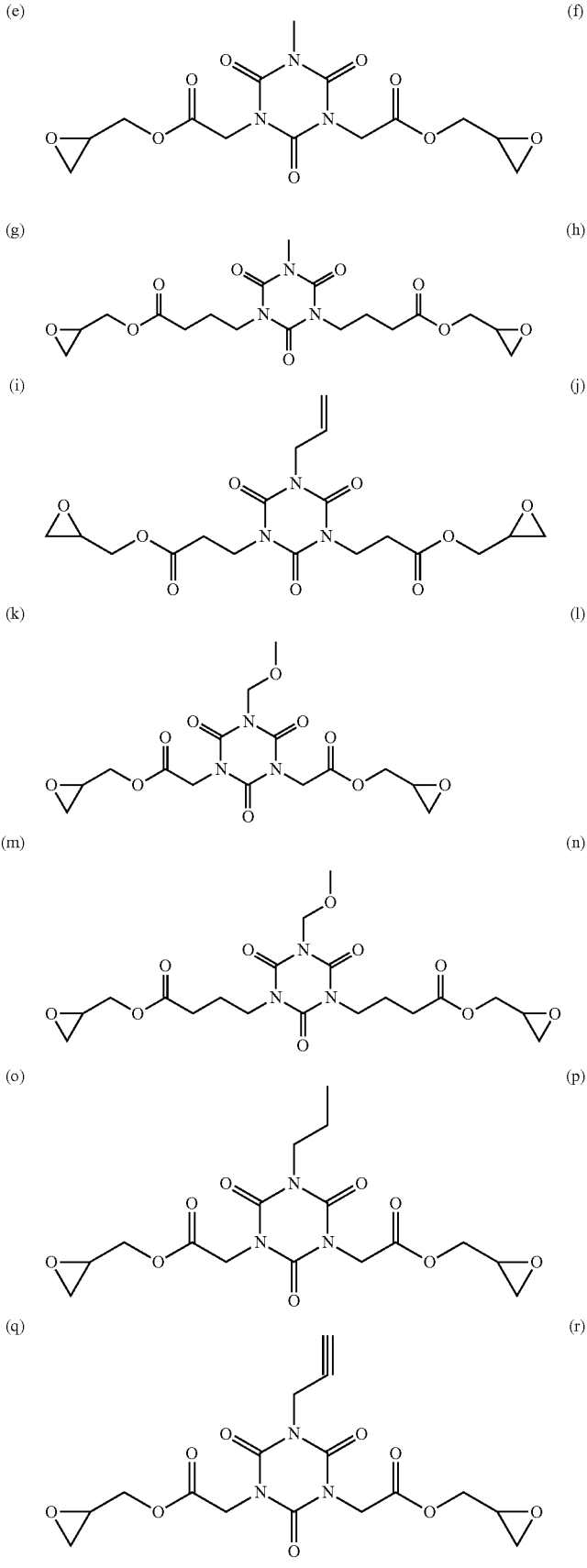

-continued
(s)
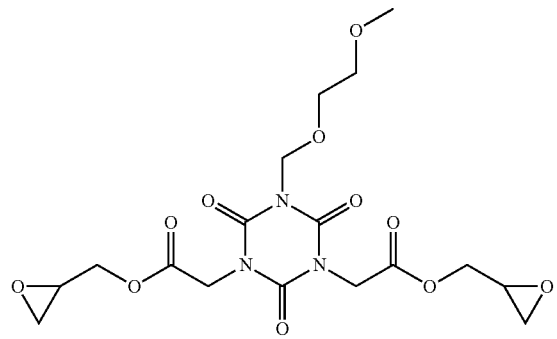
(t)
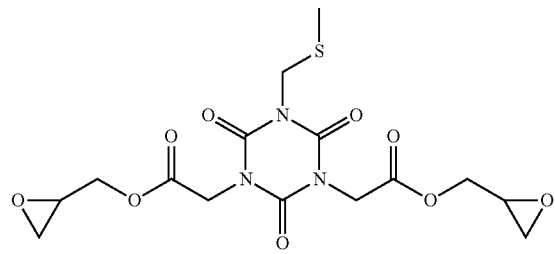
(u)
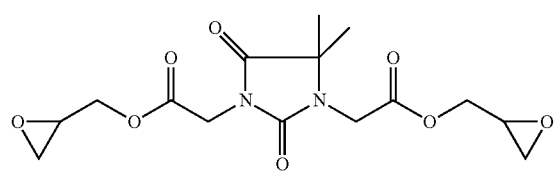
(v)
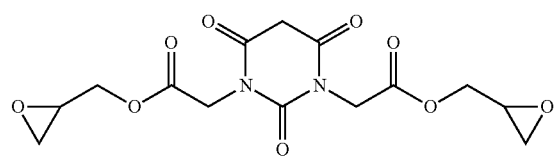
(w)
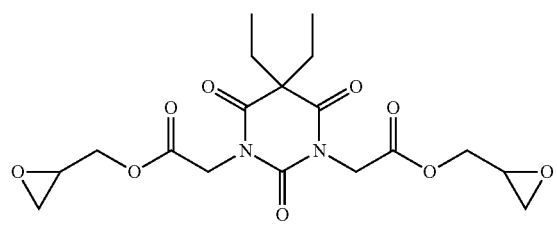
(x)
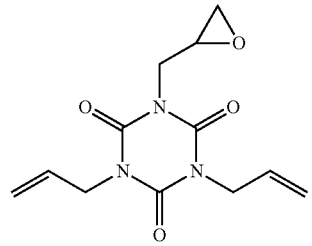
(y)
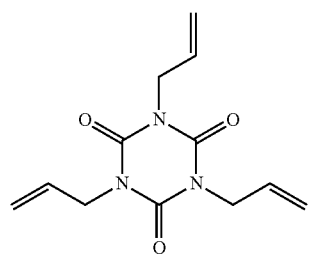
(z)
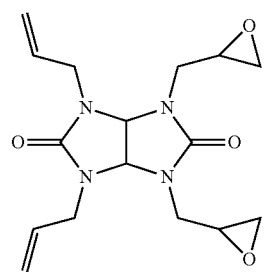
(aa)
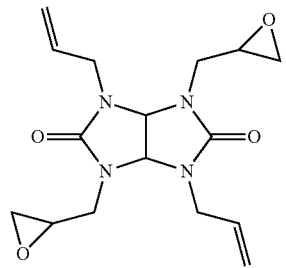
(ab)
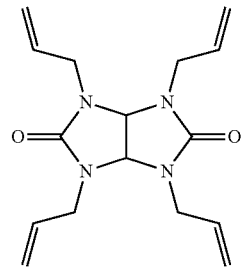

-continued
[Chem. 15]
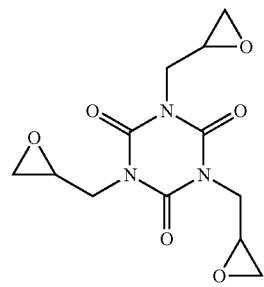
(ab)
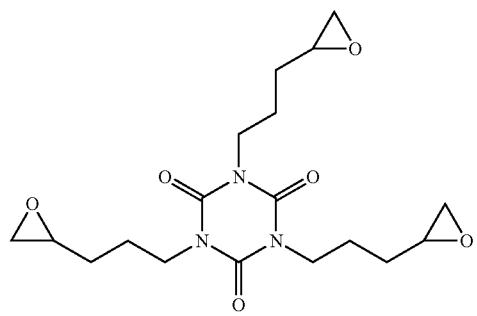
(ac)
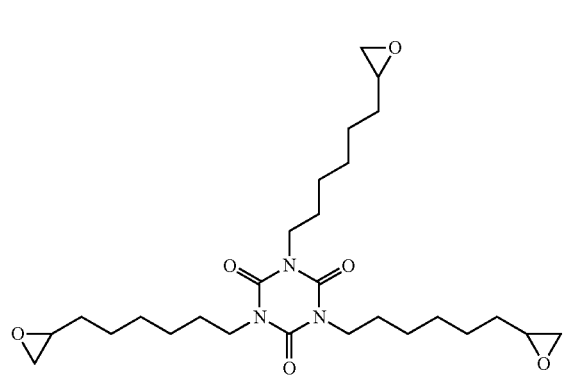
(ad)
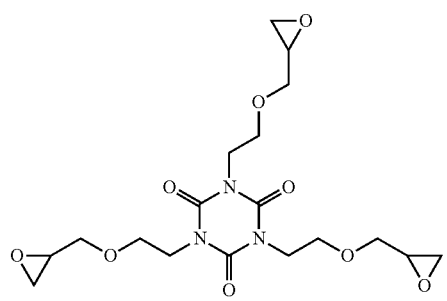
(ae)
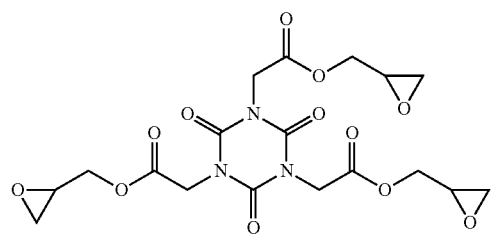
(af)
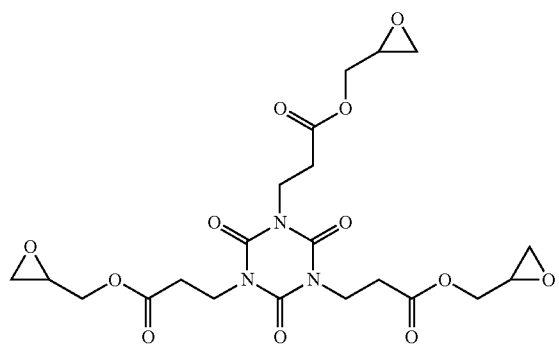
(ag)
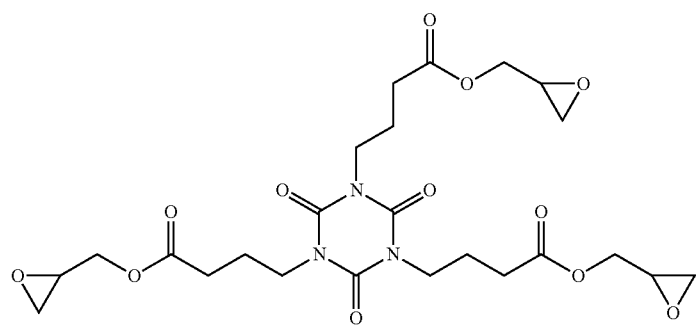
(ah)

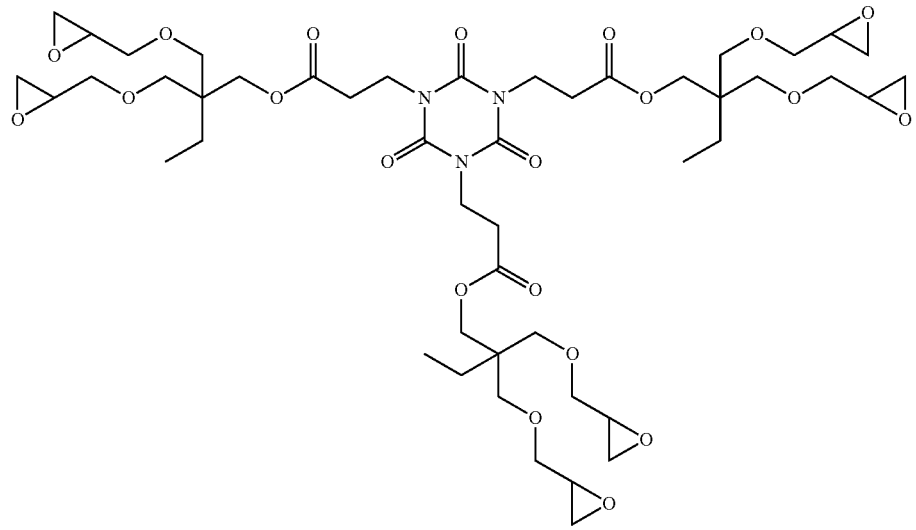
(ai)
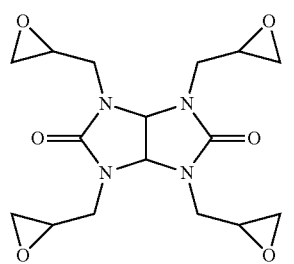
(aj)
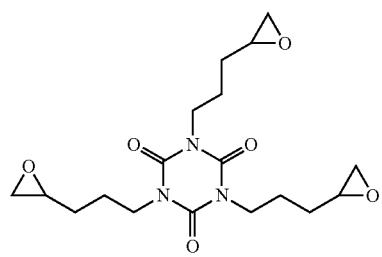
(ad)
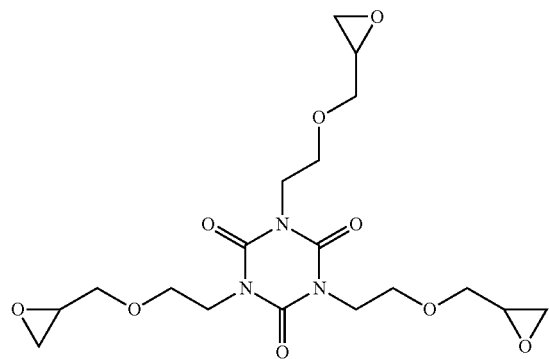
(af)
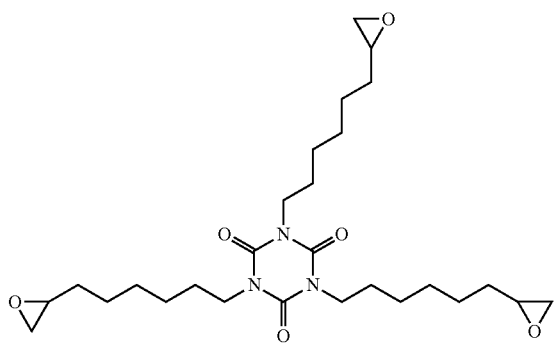
(ac)
(ae)
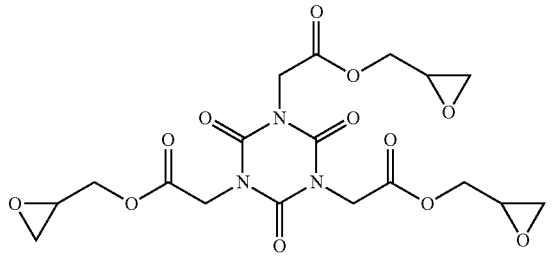
(ag)

-continued

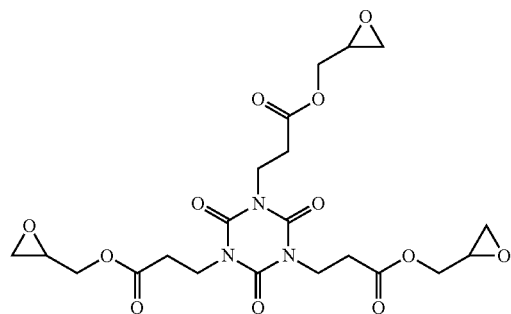
(ah)

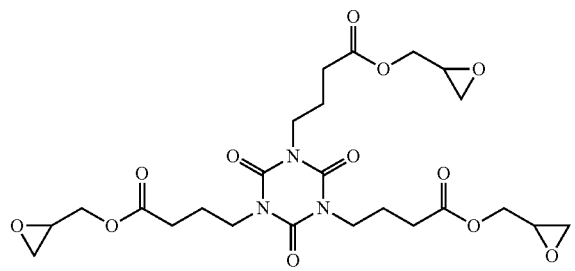
(ai)

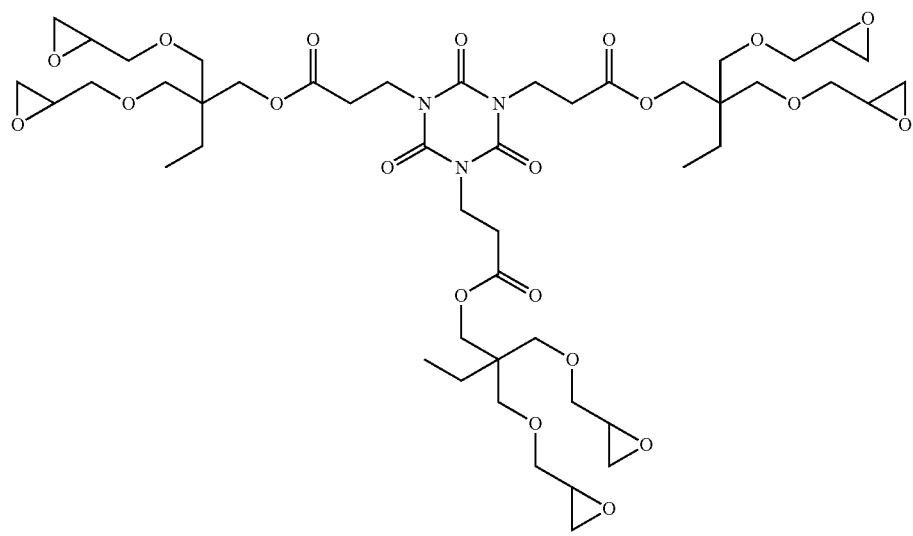
(aj)

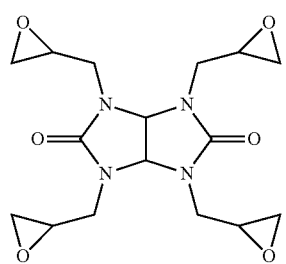
(ak)

Specific examples of the compound represented by Formula (1) are as follows. Synthesis methods will be described in detail in the section of Examples. (Theoretical molecular weight of compound represented by Formula (X-1): 799, theoretical molecular weight of compound represented by Formula (X-2): 621, theoretical molecular weight of compound represented by Formula (X-3): 471, theoretical molecular weight of compound represented by Formula (X-4): 456, theoretical molecular weight of compound represented by Formula (X-5): 573, and theoretical molecular weight of compound represented by Formula (X-6): 795)

[Chem. 16]
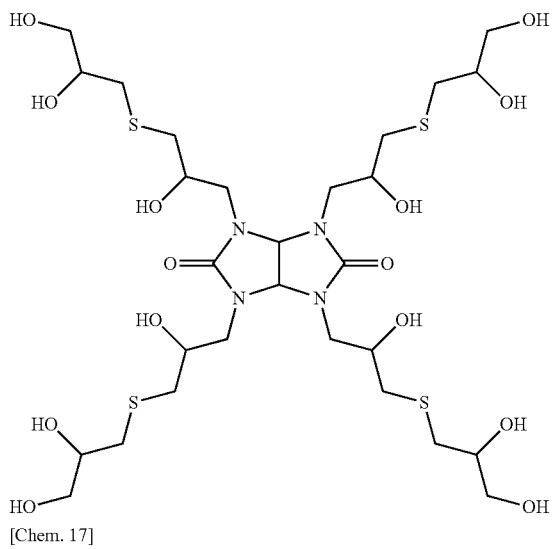
Formula (X-1)
[Chem. 17]
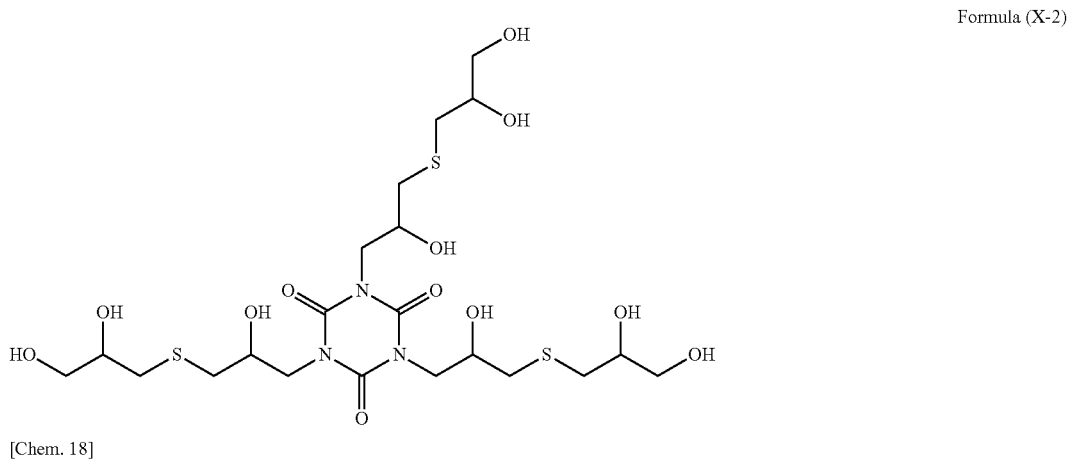
Formula (X-2)
[Chem. 18]
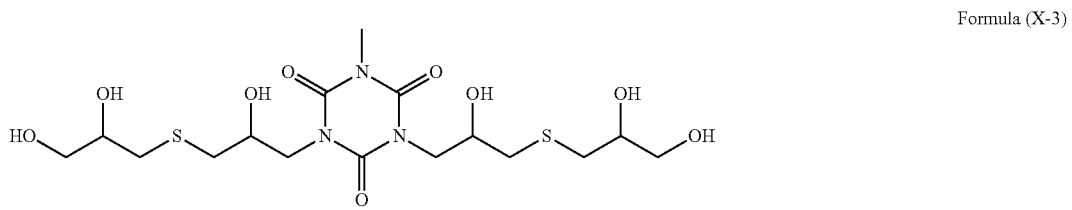
Formula (X-3)
[Chem. 19]
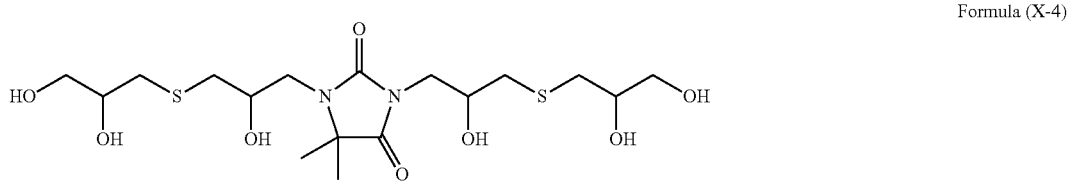
Formula (X-4)

[Chem. 20]

Formula (X-5)

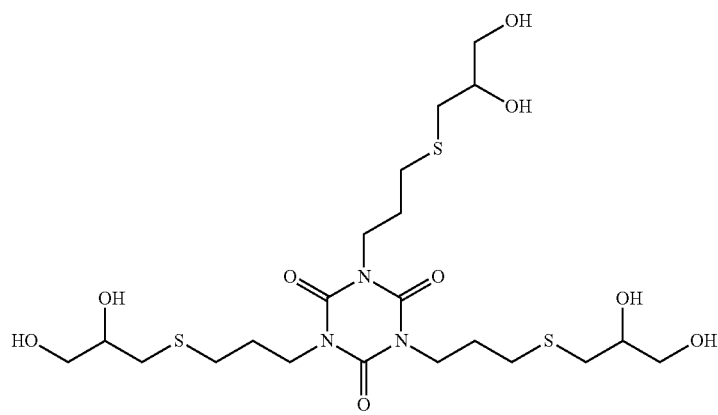

[Chem. 21]

Formula (X-6)

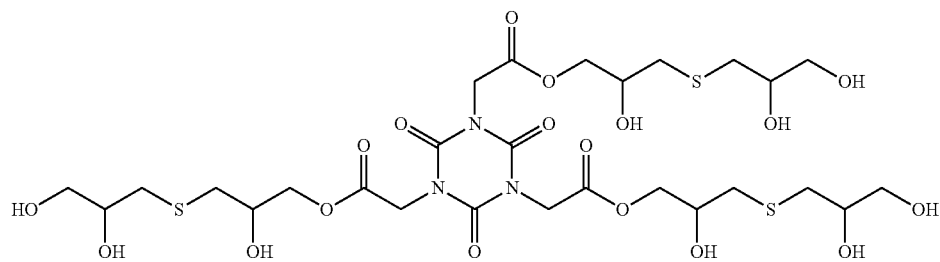

The theoretical molecular weight of the compound represented by Formula (1) is within the range of 400 to 999 and preferably 450 to 800.

<Organic Solvent>

The resist underlayer film-forming composition of the present invention may be prepared by dissolving the respective components in an organic solvent, and is used in a uniform solution state.

As the organic solvent of the resist underlayer film-forming composition according to the present invention, any organic solvent may be used without particular limitation as long as it is an organic solvent capable of dissolving solid components such as the compound and an acid catalyst described below. In particular, since the protective film-forming composition according to the present invention is used in a uniform solution state, it is recommended to use an organic solvent generally used in a lithography process in combination in consideration of application performance thereof.

Examples of the organic solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propropylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. These solvents may be used each alone or in combination of two or more thereof.

Of these solvents, propylene glycol monomethyl ether, propylene glycol monomethyl ether acetate, ethyl lactate, butyl lactate, and cyclohexanone are preferable. In particular, propylene glycol monomethyl ether and propylene glycol monomethyl ether acetate are preferable.

The resist underlayer film-forming composition of the present application may further contain an acid catalyst (an acid compound). As the acid catalyst, in addition to an acid compound and a basic compound, a compound that generates an acid or a base by heat may be used. As the acid compound, a sulfonic acid compound or a carboxylic acid compound may be used, and as the compound that generates an acid by heat, a thermal acid generator may be used.

Examples of the sulfonic acid compound or the carboxylic acid compound include p-toluenesulfonic acid, trifluoromethanesulfonic acid, pyridinium trifluoromethanesulfonate (=pyridinium trifluoromethanesulfonic acid), pyridinium-p-toluenesulfonate, pyridinium-4-hydroxybenzene sulfonate, salicylic acid, camphorsulfonic acid, 5-sulfosalicylic acid, 4-chlorobenzenesulfonic acid, 4-phenolsulfonic acid, pyridinium-4-phenolsulfonate, benzenedisulfonic acid, 1-naphthalenesulfonic acid, 4-nitrobenzenesulfonic acid, citric acid, benzoic acid, and hydroxybenzoic acid.

Examples of the thermal acid generator include K-PURE [registered trademark] CXC-1612, K-PURE CXC-1614, K-PURE TAG-2172, K-PURE TAG-2179, K-PURE TAG-2678, and K-PURE TAG2689 (manufactured by King Industries, Inc.) and SI-45, SI-60, SI-80, SI-100, SI-110, and SI-150 (manufactured by SANSHIN CHEMICAL INDUSTRY CO., LTD.).

These acid catalysts may be used each alone or in combination of two or more thereof. In addition, as the basic compound, an amine compound or an ammonium hydroxide compound may be used, and as the compound that generates a base by heat, urea may be used.

Examples of the amine compound include tertiary amines such as triethanolamine, tributanolamine, trimethylamine, triethylamine, tri-n-propylamine, tri-isopropylamine, tri-n-butylamine, tri-tert-butylamine, tri-n-octylamine, tri-isopropanolamine, phenyldiethanolamine, stearyldiethanolamine, and diazabicyclooctane, and aromatic amines such as pyridine and 4-dimethylaminopyridine. In addition, examples of the amine compound include primary amines such as benzylamine and n-butylamine, and secondary amines such as diethylamine and di-n-butylamine. These amine compounds may be used each alone or in combination of two or more thereof.

Examples of the ammonium hydroxide compound include tetramethylammonium hydroxide, tetraethylammonium hydroxide, tetrapropylammonium hydroxide, tetrabutylammonium hydroxide, benzyltrimethylammonium hydroxide, benzyltriethylammonium hydroxide, cetyltrimethylammonium hydroxide, phenyltrimethylammonium hydroxide, and phenyltriethylammonium hydroxide.

In addition, as the compound that generates a base by heat, for example, a compound that has a thermally unstable group such as an amide group, a urethane group, or an aziridine group and produces an amine by heating may be used. In addition, examples of the compound that generates a base by heat include urea, benzyltrimethylammonium chloride, benzyltriethylammonium chloride, benzyldimetbylphenylammonium chloride, benzyldodecyldimethylammonium chloride, benzyltributylammonium chloride, and choline chloride.

In a case where the resist underlayer film-forming composition of the present application contains an acid catalyst, the content thereof is within the range of 0.0001 to 20% by mass, preferably 0.01 to 15% by mass, and more preferably 0.1 to 10% by mass, with respect to the total solid content in the resist underlayer film-forming composition.

The solid content in the resist underlayer film-forming composition according to the present invention is usually within the range of 0.1 to 70% by mass and preferably 0.1 to 60% by mass. The solid content is a content ratio of all components excluding the solvent from the resist underlayer film-forming composition. The ratio of the polymer in the solid content is within the range of 1 to 100% by mass, 1 to 99.9% by mass, 50 to 99.9% by mass, 50 to 95% by mass, and 50 to 90% by mass, with increasing preference.

<Crosslinking Agent>

The resist underlayer film-forming composition of the present invention may contain a crosslinking agent. Examples of the crosslinking agent include a melamine-based crosslinking agent, a substituted urea-based crosslinking agent, and a polymer-based crosslinking agent thereof. Preferably, the crosslinking agent is a crosslinking agent having at least two crosslink forming substituents, which is a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or butoxymethylated thiourea. In addition, condensates of these compounds may also be used.

In addition, as the crosslinking agent, a crosslinking agent having high heat resistance may be used. As the crosslinking agent having high heat resistance, a compound having a crosslink-forming substituent having an aromatic ring (for example, a benzene ring or a naphthalene ring) in the molecule may be used.

Examples of the compound include a compound having a partial structure of the following Formula (5-1) and a polymer or oligomer having a repeating unit of the following Formula (5-2).

[Chem. 22]

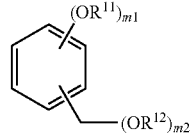

Formula (5-1)

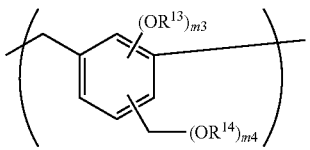

Formula (5-2)

Each of $R^{11}$, $R^{12}$, $R^{13}$, and $R^{14}$ is a hydrogen atom or an alkyl group having 1 to 10 carbon atoms, and specific examples of the alkyl group are as described above.

m1 meets $1 \leq m1 \leq 6-m2$, m2 meets $1 \leq m2 \leq 5$, m3 meets $1 \leq m3 \leq 4-m2$, and m4 meets $1 \leq m4 \leq 3$.

Examples of the compound of Formula (5-1) and the polymer and oligomer of Formula (5-2) are as follows.

[Chem. 23]

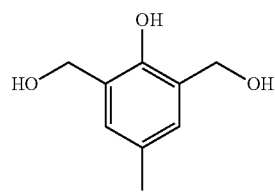

Formula (6-1)

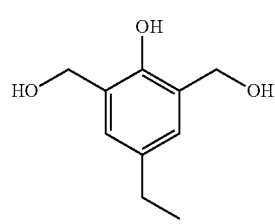

Formula (6-2)

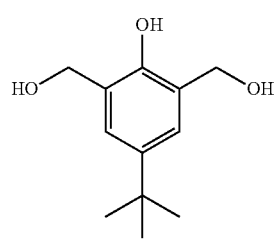

Formula (6-3)

Formula (6-4)
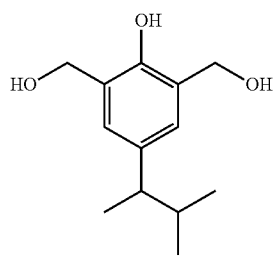
Formula (6-5)
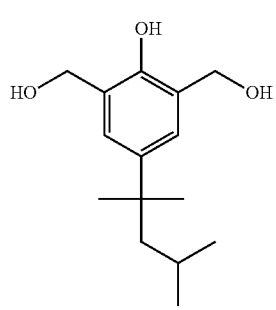
Formula (6-6)
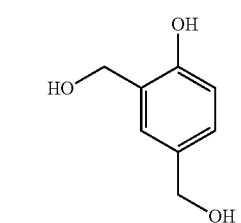
Formula (6-6)
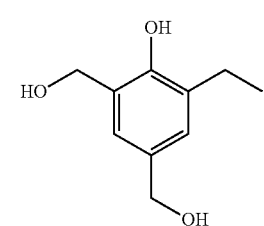
Formula (6-7)
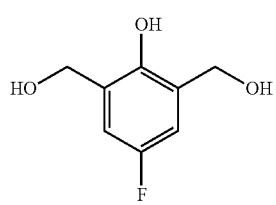
Formula (6-8)
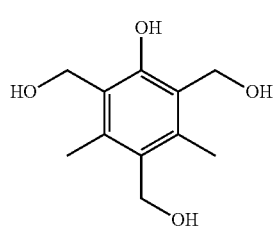
Formula (6-9)
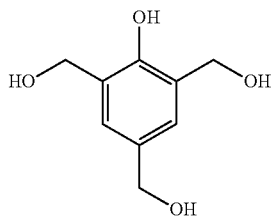
Formula (6-10)
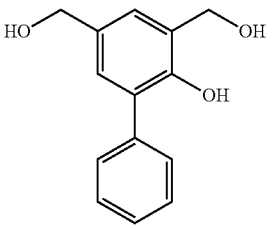
Formula (6-11)
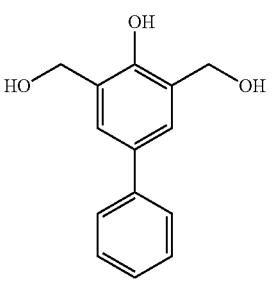
Formula (6-12)
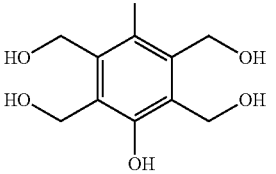
Formula (6-13)
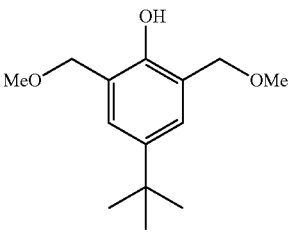
Formula (6-14)
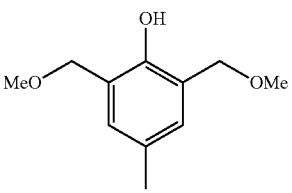
[Chem. 24]
Formula (6-15)
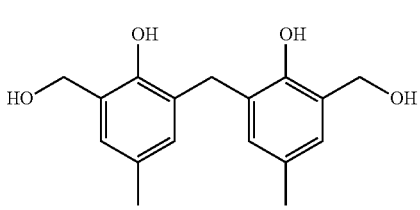

-continued

Formula (6-16)
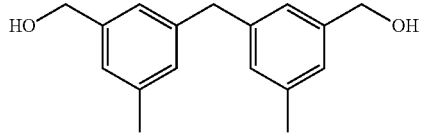

Formula (6-17)
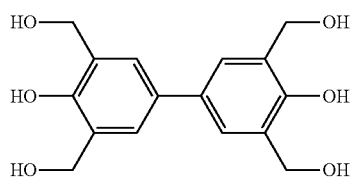

Formula (6-18)
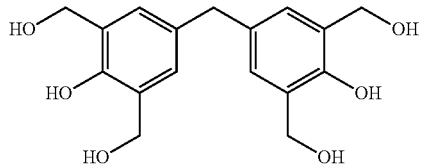

Formula (6-19)
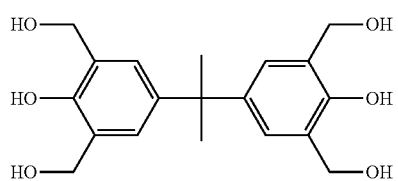

Formula (6-20)
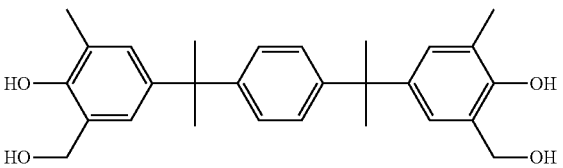

Formula (6-21)
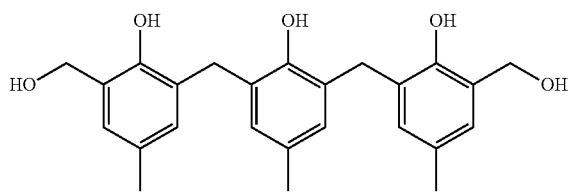

Formula (6-22)
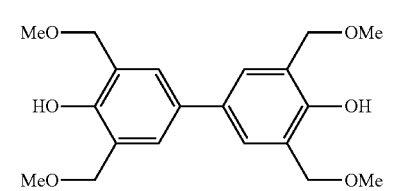

Formula (6-23)
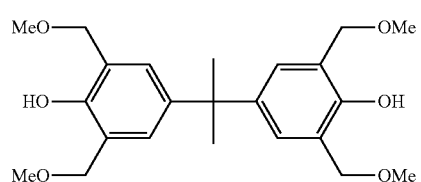

Formula (6-24)
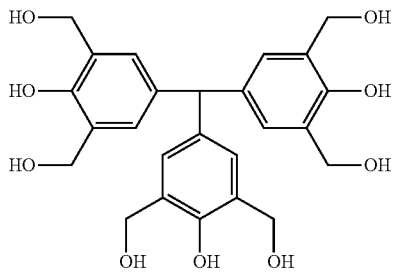

Formula (6-25)
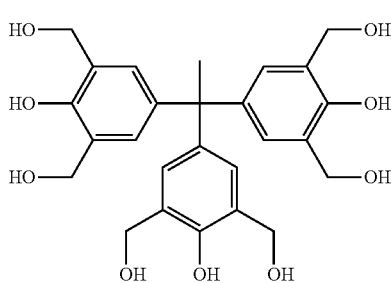

Formula (6-26)
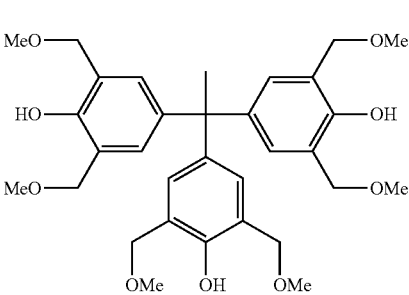

The compounds are available as products from ASAHI YUKIZAI CORPORATION and Honshu Chemical Industry Co., Ltd. For example, the compound of Formula (6-22) in the cros slinking agent is available as TMOM-BP (trade name) from Honshu Chemical Industry Co., Ltd.

The amount of the crosslinking agent added varies depending on a coating solvent to be used, a base substrate to be used, a required solution viscosity, a required film shape, and the like, and is within the range of 0.001 to 80% by mass, preferably 0.01 to 50% by mass, and more preferably 0.1 to 40% by mass, with respect to the total solid content in the resist underlayer film-forming composition. The crosslinking agent may cause a crosslinking reaction due to self-condensation. However, in a case where a crosslinkable substituent is present in the polymer of the present invention, the crosslinking agent may cause a crosslinking reaction with the crosslinkable substituent.

<Surfactant>

The resist film-forming composition of the present invention may contain a surfactant for improving a coating property to the semiconductor substrate. Examples of the surfactant include nonionic surfactants such as polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants such as EFTOP [registered trademark] EF301, EFTOP EF303, and EFTOP EF352 (manufactured by Mitsubishi Materials Electronic Chemicals Co., Ltd.), Megafac [registered trademark] F171, Megafac F173, Megafac R-30, Megafac R-30N, Megafac R-40, and Megafac R-40-LM (manufactured by DIC Corporation), Fluorad FC430 and Fluorad FC431 (manufactured by Sumitomo 3M Limited), AsahiGuard [registered trademark] AG710 and Surflon [registered trademark] S-382, Surflon SC101, Surflon SC102, Surflon SC103, Surflon SC104, Surflon SC105, and Surflon SC106 (manufactured by AGC Inc.); and Organosiloxane polymer KP341 (manufactured by Shin-Etsu Chemical Co., Ltd.). These surfactants may be used each alone or in combination of two or more thereof. In a case where the protective film-forming composition contains a surfactant, the content thereof is within the range of 0.0001 to 10% by weight, and preferably 0.01 to 5% by weight, with respect to the total solid content in the protective film-forming composition.

<Protective Film-Forming Composition>

The protective film-forming composition of the present application contains: a compound represented by the following Formula (1), having a theoretical molecular weight of 999 or less, and containing 2 or more, 3 or more, or 4 or more nitrogen atoms and 6 or more, 8 or more, 9 or more, 10 or more, or 15 or more oxygen atoms in a molecule; and an organic solvent.

Moreover, it is preferable that the compound contains 2 or more, 3 or more, 4 or more, 5 or more, or 6 or more sulfur atoms.

The reason why a certain number or more of the specific atoms are contained is to increase the dry etching rate of the protective film.

[Chem. 25]

Formula (1)

In Formula (1), $Z_1$ contains a nitrogen-containing heterocyclic ring; U is a monovalent organic group represented by the following Formula (2); and p represents an integer of 2 to 4.

[Chem. 26]

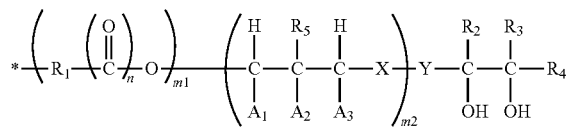

Formula (2)

In Formula (2), $R_1$ represents an a single bond or an alkylene group having 1 to 4 carbon atoms; $A_1$ to $A_3$ each independently represent a hydrogen atom, a methyl group, or an ethyl group; X represents any of —COO—, —OCO—, —O—, —S—, or $NR_a$—, $R_a$ represents a hydrogen atom or a methyl group; Y represents a direct bond or an alkylene group having 1 to 4 carbon atoms which may be substituted; $R_2$, $R_3$, and $R_4$ are each independently a hydrogen atom, or an alkyl group having 1 to 10 carbon atoms which may be substituted or an aryl group having 6 to 40 carbon atoms which may be substituted; $R_5$ is a hydrogen atom or a hydroxy group; n represents an integer of 0 or 1; m1 and m2 each independently represent an integer of 0 or 1; and * represents a binding site to $Z_1$.

m2 is preferably 1, and m1 is preferably 1.

It is most preferable that m1 is 0 when m2 is 1.

Preferably, $Z_1$ is represented by the following Formula (3).

[Chem. 27]

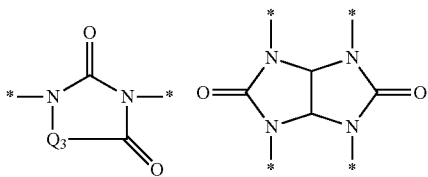

Formula (3)

In Formula (3), $Q_3$ represents the following Formula (4), Formula (5), or Formula (6):

[Chem. 28]

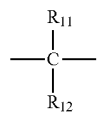

Formula (4)

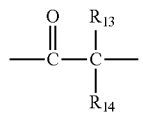

Formula (5)

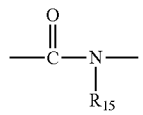

Formula (6)

In Formula (4), Formula (5), and Formula (6), $R_{11}$, $R_{12}$, $R_{13}$, and $R_{14}$ each independently represent a hydrogen atom, an alkyl group having 1 to 10 carbon atoms which may be interrupted by an oxygen atom or a sulfur atom, an alkenyl group having 2 to 10 carbon atoms which may be interrupted by an oxygen atom or a sulfur atom, an alkynyl group having 2 to 10 carbon atoms which may be interrupted by an oxygen atom or a sulfur atom, a benzyl group, or a phenyl group, in which the phenyl group may be substituted with at least one monovalent functional group selected from the group consisting of an alkyl group having 1 to 6 carbon atoms, a halogen atom, an alkoxy group having 1 to 10 atoms, a nitro group, a cyano group, and an alkylthio group having 1 to 6 carbon atoms, $R_{15}$ represents a hydrogen atom, an alkyl group having 1 to 10 carbon atoms which may be interrupted by an oxygen atom or a sulfur atom and may be substituted with a hydroxy group, an alkenyl group having 3 to 10 carbon atoms which may be interrupted by an oxygen atom or a sulfur atom, an alkynyl group having 3 to 10 carbon atoms which may be interrupted by an oxygen atom or a sulfur atom, a benzyl group, or a phenyl group, in which the phenyl group may be substituted with at least one monovalent functional group selected from the group consisting of an alkyl group having 1 to 6 carbon atoms, a halogen atom, an alkoxy group having 1 to 10 carbon atoms, a nitro group, a cyano group, an alkylthio group having 1 to 6 carbon atoms, and a monovalent organic group represented by U in Formula (1); and * represents a binding site to U.

Preferably, $R_{15}$ is an alkyl group having 1 to 10 carbon atoms or a monovalent organic group represented by U in Formula (1).

Preferably, $R_{11}$ and $R_{12}$ are each independently an alkyl group having 1 to 10 carbon atoms.

Preferably, X is —S—. Preferably, Y is a methylene group.

Preferably, the protective film-forming composition further contains an acid compound and/or a crosslinking agent.

Preferably, the protective film-forming composition further contains a surfactant.

The acid catalyst, the content of the acid catalyst, and the organic solvent are the same as those of the resist underlayer film-forming composition described above.

A solid content in the protective film-forming composition according to the present invention is usually within the range of 0.1 to 70% by mass and preferably 0.1 to 60% by mass. The solid content is a content ratio of all components excluding the solvent from the protective film-forming composition. The ratio of the polymer in the solid content is 1 to 100% by mass, 1 to 99.9% by mass, 50 to 99.9% by mass, 50 to 95% by mass, and 50 to 90% by mass, with increasing preference.

<Crosslinking Agent>

The protective film-forming composition of the present invention may contain a crosslinking agent. The crosslinking agent is the same as that of the resist underlayer film-forming composition.

<Surfactant>

The protective film-forming composition of the present invention may contain a surfactant for improving a coating property to the semiconductor substrate. The surfactant is the same as that of the resist underlayer film-forming composition.

<Resist Underlayer Film, Protective Film, Substrate with Resist Pattern, and Method for Manufacturing Semiconductor Device>

Hereinafter, a method for manufacturing a substrate with a resist pattern using the resist underlayer film-forming composition (protective film-forming composition) and a method for manufacturing a semiconductor device according to the present invention will be described.

The substrate with the resist pattern according to the present invention may be manufactured by applying the resist underlayer film-forming composition (protective film-forming composition) onto a semiconductor substrate and baking the applied composition.

Examples of the semiconductor substrate to which the resist underlayer film-forming composition (protective film-forming composition) of the present invention is applied include a silicon wafer, a germanium wafer, and a semiconductor wafer formed of a compound such as gallium arsenide, indium phosphide, gallium nitride, indium nitride, or aluminum nitride.

In a case where a semiconductor substrate carrying an inorganic film formed on a surface thereof is used, the inorganic film is formed by, for example, an atomic layer deposition (ALD) method, a chemical vapor deposition (CVD) method, a reactive sputtering method, an ion-plating method, a vacuum deposition method, or a spin coating method (spin on glass: SOG). Examples of the inorganic film include a polysilicon film, a silicon oxide film, a silicon nitride film, a silicon oxynitride film, a Boro-Phospho Silicate Glass (BPSG) film, a titanium nitride film, a titanium oxynitride film, a tungsten nitride film, a gallium nitride film, and a gallium arsenide film. The semiconductor substrate may be a stepped substrate, in which the so-called vias (holes), trenches (grooves), and the like are formed. For example, the via has a substantially circular shape when viewed from an upper surface, a substantially circular diameter of the via is, for example, within the range of 1 nm to 20 nm, a depth of the via is within the range of 50 nm to 500 nm, and a width of the groove (a recess of the substrate) of the trench is, for example, within the range of 2 nm to 20 nm, and a depth of the trench is within the range of 50 nm to 500 nm. Because the compound contained in the protective film-forming composition (resist underlayer film-forming composition) of the present application has a small weight average molecular weight and average particle size, it is possible to embed the composition even in the stepped substrate as described above without a defect such as a void. It is an important advantage that there is no defect such as a void for the following process steps (wet etching/dry etching of the semiconductor substrate, or resist pattern formation) in the manufacture of a semiconductor.

The resist underlayer film-forming composition (protective film-forming composition) of the present invention is applied onto the semiconductor substrate by an appropriate application method such as a spinner or a coater. Thereafter, baking is performed using heating means such as a hot plate to form a resist underlayer film (protective film). The conditions for baking are appropriately selected from a baking temperature of 100° C. to 400° C. and a baking time of 0.3 minutes to 60 minutes.

Preferably, the baking temperature is selected from 120° C. to 350° C. and the baking time is selected from 0.5 minutes to 30 minutes, and more preferably, the baking temperature is selected from 150° C. to 300° C. and the baking time is selected from 0.8 minutes to 10 minutes. The thickness of the formed protective film is, for example, within the range of 0.001 µm to 10 µm, preferably 0.002 µm to 1 µm, and more preferably 0.005 µm (5 nm) to 0.5 µm (500 nm), 0.05 µm (50 nm) to 0.3 µm (300 nm), or 0.05 µm (50 nm) to 0.2 µm (200 nm). When the temperature during the baking is lower than the above range, the crosslinking may be insufficient, and the resistance of the formed resist underlayer film (protective film) to a resist solvent or a basic hydrogen peroxide aqueous solution may be hardly obtained. On the other hand, when the temperature during the baking is higher than the above range, the resist underlayer film (protective film) may be decomposed by heat.

The exposure is performed through a mask (reticle) for forming a predetermined pattern, using i rays, KrF energy lasers, ArF energy lasers, extreme ultraviolet (EUV) rays, or electron beams (EB), for example. In the development, an alkali developer is used, and the development temperature and development time are appropriately selected from 5° C. to 50° C. and 10 seconds to 300 seconds, respectively. As the alkali developer may be used, for example, aqueous solutions of alkalis, for example, inorganic alkalis such as sodium hydroxide, potassium hydroxide, sodium carbonate, sodium silicate, sodium metasilicate, and ammonia water; primary amines such as ethylamine and n-propylamine; secondary amines such as diethylamine and di-n-butyl amine; tertiary amines such as triethylamine and methyldiethylamine; alcoholamines such as dimethylethanolamine and triethanolamine; quaternary ammonium salts such as tetramethylammonium hydroxide, tetraethylammonium hydroxide, and choline; and cyclic amines such as pyrrole and piperidine. Moreover, an appropriate amount of alcohols such as isopropyl alcohol and a surfactant such as a nonionic surfactant may be added to the aqueous solution of alkalis. Of these, the preferred developer is a quaternary ammonium salt and more preferable are tetramethylammonium hydroxide and choline. Moreover, a surfactant or the like may be added to the developer. A method of performing development with an organic solvent such as butyl acetate in place of the alkali developer, and developing the portion where an alkali dissolution rate of the photoresist is not increased may also be used.

Next, the resist underlayer film (protective film) is dry-etched using the formed resist pattern as a mask. At this time, the surface of the inorganic film is exposed, when the inorganic film is formed on the surface of the semiconductor substrate used; and the surface of the semiconductor substrate is exposed, when the inorganic film is not formed on the surface of the semiconductor substrate used.

Thereafter, a desired pattern is formed by carrying out wet etching using a semiconductor wet etching solution using the dry-etched resist underlayer film (protective film) (also the resist pattern in a case where the resist pattern remains on the resist underlayer film/protective film) as a mask.

As the semiconductor wet etching solution, a general chemical solution for etching a semiconductor wafer may be used, and for example, both a substance exhibiting acidity and a substance exhibiting basicity can be used.

Examples of the substance exhibiting acidity include hydrogen peroxide, hydrofluoric acid, ammonium fluoride, acidic ammonium fluoride, ammonium hydrogen fluoride, buffered hydrofluoric acid, hydrochloric acid, nitric acid, sulfuric acid, phosphoric acid, and a mixed solution thereof.

Examples of the substance exhibiting basicity include basic hydrogen peroxide aqueous solutions obtained by mixing ammonia, sodium hydroxide, potassium hydroxide, sodium cyanide, potassium cyanide, or an organic amine such as triethanolamine with aqueous hydrogen peroxide, and adjusting the pH to a basic pH.

Specific examples thereof include SC-1 (ammonia-hydrogen peroxide solution). In addition, a substance capable of adjusting a pH to a basic pH, for example, a substance capable of finally adjusting a pH to a basic pH by mixing urea with a hydrogen peroxide solution and causing thermal decomposition of urea by heating to generate ammonia, may be used as a chemical solution for wet etching.

Of these, aqueous acidic hydrogen peroxide or aqueous basic hydrogen peroxide is preferable.

These chemical solutions may contain an additive such as a surfactant.

The use temperature of the semiconductor wet etching solution is desirably within the range of 25° C. to 90° C. and more desirably 40° C. to 80° C. The wet etching time is desirably within the range of 0.5 minutes to 30 minutes and more desirably 1 minute to 20 minutes.

EXAMPLES

Next, the present invention will be described in detail with reference to Synthesis Examples and Examples, but the present invention is not limited thereto.

The weight average molecular weight of a polymer described in the following Synthesis Examples of the present specification is the result of measurement by gel permeation chromatography (hereinafter, abbreviated as GPC).

For the measurement, a GPC apparatus manufactured by Tosoh Corporation is used, and the measurement conditions and the like are as follows.

Column temperature: 40° C.

Flow rate: 0.6 mL/min

Eluent: N,N-dimethylformamide (DMF)

Standard sample: polystyrene (Tosoh Corporation)

Synthesis Example 1

In a reaction flask, 43.26 g of propylene glycol monomethyl ether was added to 4.00 g of 1,3,4,6-(tetraglycidyl) glycoluril (product name: TG-G, manufactured by Shikoku Chemicals Corporation), 6.26 g of 1-thioglycerol (manufactured by FUJIFILM Wako Pure Chemical Corporation), and 0.54 g of tetrabutylphosphonium bromide (manufactured by HOKKO CHEMICAL INDUSTRY CO., LTD.). The flask was then heated and stirred at 105° C. for 22 hours under a nitrogen atmosphere. The obtained reaction product corresponded to Formula (X-1), and had a theoretical molecular weight of 799, and a weight average molecular weight Mw measured in terms of polystyrene by GPC of 980.

[Chem. 29]

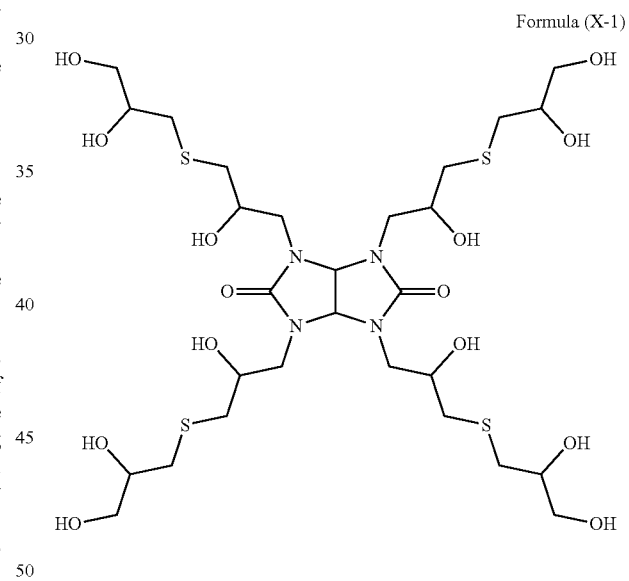

Formula (X-1)

Synthesis Example 2

In a reaction flask, 42.68 g of propylene glycol monomethyl ether was added to 5.00 g of triglycidyl isocyanurate (product name: TEPIC, manufactured by Nissan Chemical Corporation), 5.45 g of 1-thioglycerol (manufactured by FUJIFILM Wako Pure Chemical Corporation), and 0.21 g of tetrabutylphosphonium bromide (manufactured by HOKKO CHEMICAL INDUSTRY CO., LTD.). The flask was then heated and stirred at 105° C. for 23 hours under a nitrogen atmosphere. The obtained reaction product corresponded to Formula (X-2), and had a theoretical molecular weight of 621, and a weight average molecular weight Mw measured in terms of polystyrene by GPC of 870.

[Chem. 30]

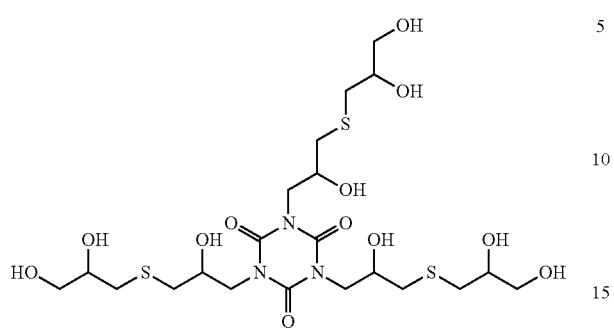

Formula (X-2)

Synthesis Example 3

In a reaction flask, 24.52 g of propylene glycol monomethyl ether was added to 16.00 g of diglycidyl methyl isocyanurate (product name: MeDGIC, Shikoku Chemicals Corporation, 28.8% by weight solution in propylene glycol monomethyl ether), 3.88 g of 1-thioglycerol (manufactured by FUJIFILM Wako Pure Chemical Corporation), and 0.45 g of tetrabutylphosphonium bromide (manufactured by HOKKO CHEMICAL INDUSTRY CO., LTD.). The flask was then heated and stirred at 105° C. for 18 hours under a nitrogen atmosphere. The obtained reaction product corresponded to Formula (X-3), and had a theoretical molecular weight of 471, and a weight average molecular weight Mw measured in terms of polystyrene by GPC of 600.

[Chem. 31]

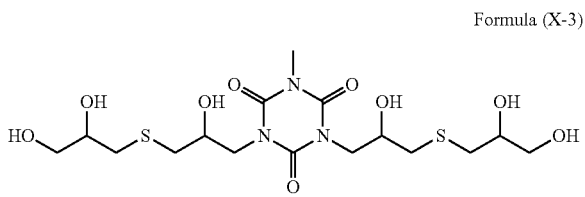

Formula (X-3)

[Chem. 33]

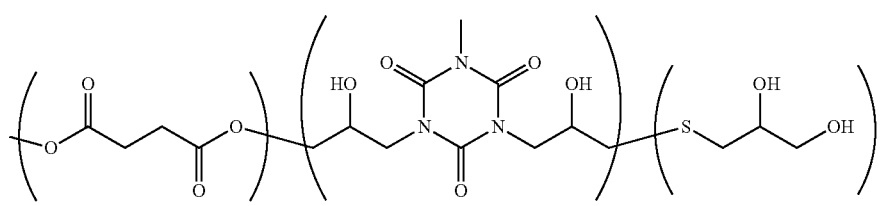

Synthesis Example 4

A solution of 3.00 g of glycerin monomethacrylate (product name: Blenmer GLM, manufactured by NOF CORPORATION) and 0.90 g of 2,2'-azobis(methyl isobutyrate) (manufactured by FUJIFILM Wako Pure Chemical Corporation) in 16.44 g of propylene glycol monomethyl ether was added to a dropping funnel. The solution was added dropwise to a reaction flask charged with 4.11 g of propylene glycol monomethyl ether at 100° C. under a nitrogen atmosphere. The flaks was then heated and stirred for 15 hours. The obtained reaction product corresponded to Formula (X-7), and had a weight average molecular weight Mw measured in terms of polystyrene by GPC of 4,160.

[Chem. 32]

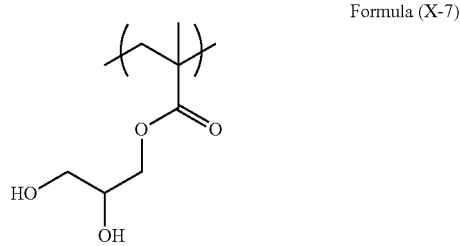

Formula (X-7)

Synthesis Example 5

In a reaction flask, 12.85 g of propylene glycol monomethyl ether was added to 11.00 g of diglycidyl methyl isocyanurate (product name: MeDGIC, Shikoku Chemicals Corporation, 28.8% by weight solution in propylene glycol monomethyl ether), 1.16 g of succinic acid (manufactured by Tokyo Chemical Industry Co., Ltd.), 0.53 g of 1-thioglycerol (manufactured by FUJIFILM Wako Pure Chemical Corporation), and 0.29 g of ethyltriphenylphosphonium bromide (manufactured by Tokyo Chemical Industry Co., Ltd.). The flask was then heated and stirred at 100° C. for 18 hours under a nitrogen atmosphere. The obtained reaction product corresponded to Formula (X-8), and had a weight average molecular weight Mw measured in terms of polystyrene by GPC of 2,800.

Formula (X-8)

Example 1

To 8.22 g of a solution of the reaction product (the solid content was 15.5% by weight) corresponding to Formula (X-1) were added 0.06 g of pyridinium trifluoromethanesulfonic acid (manufactured by Tokyo Chemical Industry Co., Ltd.), 0.01 g of a surfactant (product name: Megafac R-40, manufactured by DIC Corporation), 18.84 g of propylene glycol monomethyl ether, and 2.87 g of propylene glycol monomethyl ether acetate, thereby preparing a solution. The solution was filtered using a polyethylene microfilter having a pore size of 0.02 µm to prepare a resist underlayer film (protective film) forming composition.

Example 2

To 7.12 g of a solution of the reaction product (the solid content was 17.8% by weight) corresponding to Formula (X-2) were added 0.06 g of pyridinium trifluoromethanesulfonic acid (manufactured by Tokyo Chemical Industry Co., Ltd.), 0.01 g of a surfactant (product name: Megafac R-40, manufactured by DIC Corporation), 19.90 g of propylene glycol monomethyl ether, and 2.87 g of propylene glycol monomethyl ether acetate, thereby preparing a solution. The solution was filtered using a polyethylene microfilter having a pore size of 0.02 µm to prepare a resist underlayer film (protective film) forming composition.

Example 3

To 7.12 g of a solution of the reaction product (the solid content was 17.9% by weight) corresponding to Formula (X-3) were added 0.06 g of pyridinium trifluoromethanesulfonic acid (manufactured by Tokyo Chemical Industry Co., Ltd.), 0.01 g of a surfactant (product name: Megafac R-40, manufactured by DIC Corporation), 19.94 g of propylene glycol monomethyl ether, and 2.87 g of propylene glycol monomethyl ether acetate, thereby preparing a solution. The solution was filtered using a polyethylene microfilter having a pore size of 0.02 µm to prepare a resist underlayer film (protective film) forming composition.

Example 4

To 6.32 g of a solution of the reaction product (the solid content was 17.8% by weight) corresponding to Formula (X-2) were added 0.17 g of 3,3',5,5'-tetrakis(methoxymethyl)-4,4'-dihydroxybiphenyl (product name: TMOM-BP, manufactured by Honshu Chemical Industry Co., Ltd.), 0.06 g of pyridinium trifluoromethanesulfonic acid (manufactured by Tokyo Chemical Industry Co., Ltd.), 0.01 g of a surfactant (product name: Megafac R-40, manufactured by DIC Corporation), 19.47 g of propylene glycol monomethyl ether, and 2.87 g of propylene glycol monomethyl ether acetate, thereby preparing a solution. The solution was filtered using a polyethylene microfilter having a pore size of 0.02 µm to prepare a resist underlayer film (protective film) forming composition.

Comparative Example 1

To 4.32 g of a solution of the reaction product (the solid content was 13.1% by weight) corresponding to Formula (X-7) were added 0.03 g of pyridinium trifluoromethanesulfonic acid (manufactured by Tokyo Chemical Industry Co., Ltd.), 0.01 g of a surfactant (product name: Megafac R-40, manufactured by DIC Corporation), 9.21 g of propylene glycol monomethyl ether, and 1.44 g of propylene glycol monomethyl ether acetate, thereby preparing a solution. The solution was filtered using a polyethylene microfilter having a pore size of 0.02 µm to prepare a resist underlayer film (protective film) forming composition.

Comparative Example 2

To 6.09 g of a solution of the reaction product (the solid content was 17.5% by weight) corresponding to Formula (X-8) were added 0.21 g of 3,3',5,5'-tetrakis(methoxymethyl)-4,4'-dihydroxybiphenyl (product name: TMOM-BP, manufactured by Honshu Chemical Industry Co., Ltd.), 0.01 g of pyridinium-4-hydroxybenzenesulfonate, 0.01 g of a surfactant (product name: Megafac R-40, manufactured by DIC Corporation), 20.82 g of propylene glycol monomethyl ether, and 2.87 g of propylene glycol monomethyl ether acetate, thereby preparing a solution. The solution was filtered using a polyethylene microfilter having a pore size of 0.02 µm to prepare a resist underlayer film (protective film) forming composition.

[Test for Resist Solvent Resistance]

Each of the resist underlayer film (protective film)—forming compositions prepared in Examples 1 to 4 and Comparative Examples 1 and 2 was applied (spin-coated) onto a silicon wafer with a spin coater. The composition-applied silicon wafer was heated on a hot plate at 220° C. for 1 minute to form a coating film (protective film) having a thickness of 100 nm. Next, in order to confirm resistance of the protective film to a resist solvent, the silicon wafer carrying the protective film formed thereon was immersed for 1 minute in a mixed solvent of propylene glycol monomethyl ether and propylene glycol monomethyl ether acetate at a weight ratio of 7:3, spin dried, and then baked at 100° C. for 30 seconds. The thicknesses of the protective film before and after the immersion in the mixed solvent were measured with an optical interference thickness meter (product name: NanoSpec 6100, manufactured by Nanometrics Japan, Ltd.).

The resist solvent resistance was evaluated by calculating a film thickness reduction rate (%) of the protective film removed by solvent immersion from the calculation formula of ((film thickness before solvent immersion)−(film thickness after solvent immersion))/(thickness before solvent immersion)×100. The results are shown in Table 1. Note that when the film thickness reduction rate is about 1% or less, it can be said that the film has a sufficient resist solvent resistance.

TABLE 1

| Examples | Film thickness reduction rate |
| --- | --- |
| Example 1 | −0.0% |
| Example 2 | −0.5% |
| Example 3 | −0.5% |
| Example 4 | −0.0% |
| Comparative Example 1 | −0.1% |
| Comparative Example 2 | −0.0% |

From the above results, it was confirmed that the change in film thickness of each of the resist underlayer films (protective films) of Examples 1 to 4 and Comparative Examples 1 and 2 was significantly small even after having been immersed in the resist solvent. Therefore, the protective film-forming compositions of Examples 1 to 4 have a sufficient resist solvent resistance to function as a resist underlayer film.

[Test for Resistance to Aqueous Basic Hydrogen Peroxide]

As for an evaluation of the resistance to aqueous basic hydrogen peroxide, each of the resist underlayer film-forming compositions (protective film-forming compositions) of Examples 1 to 4 and Comparative Examples 1 and 2 was applied onto a titanium nitride (TiN)—deposited substrate having a thickness of 50 nm and heated at 220° C. for 1 minute, thereby forming a protective film having a thickness of 100 nm. Next, 28% ammonia water, 33% hydrogen peroxide, and water were mixed at a weight ratio of 1:4:20 to prepare an aqueous basic hydrogen peroxide. The TiN-deposited substrate having each of the resist underlayer film-forming compositions (protective film-forming compositions) applied thereon was immersed in the aqueous basic hydrogen peroxide heated at 50° C., and the time from immediately after the immersion to the complete peeling off of the protective film from the substrate (peeling time) was measured. The results of the test for the resistance to the aqueous basic hydrogen peroxide are shown in Table 2. Note that it can be said that the longer the the peeling time, the higher the resistance to the wet etching solution using the aqueous basic hydrogen peroxide.

TABLE 2

| Examples | Peeling time of protective film |
| --- | --- |
| Example 1 | 1,200 seconds or longer |
| Example 2 | 998 seconds |
| Example 3 | 537 seconds |
| Example 4 | 1,200 seconds or longer |
| Comparative Example 1 | 203 seconds |
| Comparative Example 2 | 109 seconds |

The results in the table demonstrated that the coating films prepared using the resist underlayer film-forming compositions (protective film-forming compositions) prepared in Examples 1 to 4 had a sufficient resistance to a basic hydrogen peroxide aqueous solution. That is, it was found that the coating films of Examples 1 to 4 could serve as a protective film against a basic hydrogen peroxide aqueous solution. In addition, it can be said that the films of Examples 1 to 4 exhibited a better resistance to the wet etching solution using aqueous basic hydrogen peroxide than those of Comparative Examples 1 and 2. Therefore, the films of Examples 1 to 4 exhibited a better chemical solution resistance to aqueous basic hydrogen peroxide than those of Comparative Examples 1 and 2, and thus, the films of Examples 1 to 4 would be more useful as a protective film against the semiconductor wet etching solution.

[Evaluation of Etching Selection Ratio]

As for the evaluation of an etching selection ratio, each of the resist underlayer film-forming compositions (protective film-forming compositions) of Examples 1 to 4 and Comparative Example 1 was applied onto a silicon wafer and heated at 220° C. for 1 minute, thereby forming a protective film having a thickness of 100 nm. Next, the formed protective film was subjected to dry etching with a mixed gas of chlorine gas, nitrogen gas, and hydrogen gas using a dry etching apparatus (product name: RIE-10NR, manufactured by SAMCO Inc.), and the ratio in dry etching rate of the protective films was measured. The measurement results of the etching selection ratio are shown in Table 3. Note that it can be said that the larger the etching selection ratio, the higher the dry etching rate.

TABLE 3

| Examples | Etching selection ratio ($CF_4$) (relative to Comparative Example 1) |
| --- | --- |
| Example 1 | 1.15 |
| Example 2 | 1.27 |
| Example 3 | 1.35 |
| Example 4 | 1.16 |
| Comparative Example 1 | 1.00 |

From the above results, it can be said that the dry etching rate in Examples 1 to 4 is high, because the dry etching selection ratio in Examples 1 to 4 was higher than that in Comparative Example 1. That is, because the dry etching time required for removing the protective film could be shortened, such that damage to the base substrate could be reduced, Examples 1 to 4 are useful.

That is, in Examples 1 to 4, the resistance to the semiconductor wet etching solution using the aqueous basic hydrogen peroxide was better than that in Comparative Examples 1 and 2, and the etching rate was higher than that in Comparative Example 1. Therefore, according to the present invention, it is possible to provide a protective film-forming composition having both a high wet etching solution resistance and a high etching rate.

[Evaluation of Optical Parameters]

Each of the resist underlayer film-forming compositions (protective film-forming compositions) prepared in Examples 1 to 3 and Comparative Examples 1 and 2 described in the present specification was applied (spin-coated) onto a silicon wafer with a spin coater. The composition-applied silicon wafer was heated on a hot plate at 220° C. for 1 minute to form a protective film-forming composition (a thickness of 100 nm). Then, an n value (a refractive index) and a k value (an attenuation coefficient or an absorption coefficient) of these protective film-forming compositions were measured at a wavelength of 193 nm using a spectroscopic ellipsometer (product name: VUV-VASE VU-302, manufactured by J.A. Woollam Company). The measurement results of the optical parameters are shown in Table 4.

TABLE 4

| Examples | n/k @193 nm |
| --- | --- |
| Example 1 | 1.86/0.15 |
| Example 2 | 1.89/0.26 |
| Example 3 | 1.92/0.30 |
| Comparative Example 1 | 1.69/0.01 |
| Comparative Example 2 | 1.87/0.29 |

[Measurement of Amount of Sublimate]

The measurement of the amount of the sublimate was performed using a sublimate measuring apparatus described in WO 2007/111147 A. First, each of the resist underlayer film-forming compositions prepared in Examples 1 to 3 and Comparative Examples 1 and 2 was applied onto a silicon wafer substrate having a diameter of 4 inches by a spin coater so as to have a film thickness of 100 nm. The wafer coated with the resist underlayer film was set in a sublimate measuring apparatus integrated with a hot plate, and baked for 120 seconds, and the sublimate was collected in a quartz crystal microbalance (QCM) sensor, that is, a crystal resonator having an electrode formed thereon. The QCM sensor makes it possible to measure a small amount of mass change by utilizing the change (drop) of the frequency of the crystal resonator according to the mass of sublimate adhering to the surface (electrode) of the crystal resonator.

The detailed measurement procedure is as follows. The temperature of the hot plate of the sublimate measuring apparatus was raised to the measurement temperature shown in Table 5, a pump flow rate was set to 2.4 m³/s, and the apparatus was left for the first 60 seconds for stabilization of the apparatus. Immediately thereafter, the wafer coated with the resist underlayer film was quickly placed on a hot plate from a slide port, and the sublimate was collected between the time point of 60 seconds and the time point of 180 seconds (for 120 seconds). Note that the flow attachment (detection portion) serving as a connection between the QCM sensor of the sublimate measuring apparatus and the collection funnel portion is used without a nozzle, and as the result, an airflow flows in from the flow path (aperture: 32 mm) of the chamber unit, which is 30 mm away from the sensor (crystal resonator), without being restricted. In addition, in the QCM sensor, a material containing silicon and aluminum as main components (AlSi) was used as an electrode, the diameter (sensor diameter) of the crystal resonator was 14 mm, the electrode diameter on the surface of the crystal resonator was 5 mm, and the resonance frequency was 9 MHz.

The obtained frequency change was converted from the eigenvalue of the crystal resonator used for the measurement to a number of gram, and the relationship between the amount of sublimate of one wafer sheet coated with the resist underlayer film and the lapse of time was clarified. Note that the first 60 seconds were the time zone during which the apparatus is left for apparatus stabilization (no wafer is set), and the measured value from 60 seconds to 180 seconds after the wafer was placed on a hot plate was the measured value of the amount of sublimate of the wafer. The amount of sublimate of the resist underlayer film quantitatively determined by the apparatus is shown in Table 5 as a sublimate amount ratio. Note that the amount of sublimate is expressed by a relative value when taking the value in Comparative Example 1 as 1.

[Table 5]

TABLE 5

| Examples | Baking temperature | Amount of sublimate (relative to Comparative Example 1) |
| --- | --- | --- |
| Example 1 | 220° C. | 0.09 |
| Example 2 | 220° C. | 0.08 |
| Example 3 | 220° C. | 0.20 |
| Comparative Example 1 | 220° C. | 1.00 |
| Comparative Example 2 | 220° C. | 2.33 |

[Evaluation of Embeddability in Substrate for Evaluating Embeddability]

Figure 2:
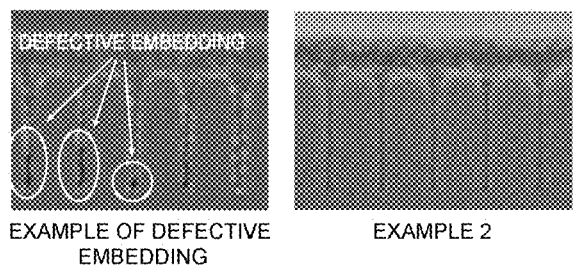
FIG. 2 is a cross-sectional SEM photograph for evaluating embeddability of a resist underlayer film-forming composition of Example 2 in a stepped substrate.

A resist underlayer film-forming composition was applied onto a silicon processed substrate, which carried a silicon oxide film formed on a surface of the trench, the silicon processed substrate having been prepared by depositing about 20 nm thickness of a silicon oxide film by a CVD method (after deposition of a silicon oxide film: a 10 nm trench (line (L)/space (S)) on a silicon substrate carrying a 50 nm trench (line (L)/space (S)) formed thereon. The composition-applied silicon processed substrate was heated on a hot plate at 220° C. for 1 minute to form a resist underlayer film having a thickness of about 100 nm. The embeddability was evaluated by observing, using a scanning electron microscope (SEM), the cross-sectional shape (FIG. 1) of the substrate having a trench, to which the resist underlayer film-forming composition obtained in Example 2 had been applied. In the resist underlayer film-forming composition of the example, it can be seen that the composition was embedded in the 10 nm trench (line (L)/space (S)) substrate having a gap between the silicon oxide films without generation of voids (FIG. 2).

INDUSTRIAL APPLICABILITY

The resist underlayer film-forming composition or the protective film-forming composition of the present invention is useful as a resist underlayer film in a semiconductor lithography process, and is further useful as a protective film in a case where a semiconductor substrate is subjected to wet etching processing.

The invention claimed is:

1. A resist underlayer film-forming composition comprising:
   a compound represented by the following Formula (1) and having a theoretical molecular weight of 999 or less; and
   an organic solvent:

Formula (1)

in Formula (1), $Z_1$ contains a nitrogen-containing heterocyclic ring; U is a monovalent organic group represented by the following Formula (2); and p represents an integer of 2 to 4,

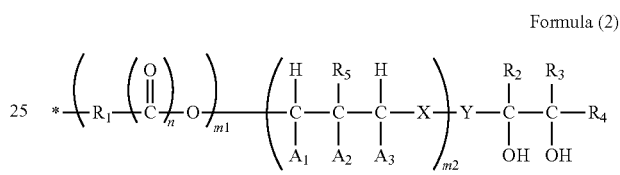

Formula (2)

in Formula (2), $R_1$ represents an alkylene group having 1 to 4 carbon atoms; $A_1$ to $A_3$ each independently represent a hydrogen atom, a methyl group, or an ethyl group; X represents any of —COO—, —OCO—, —O—, —S—, or —$NR_a$—, $R_a$ represents a hydrogen atom or a methyl group; Y represents a direct bond or an alkylene group having 1 to 4 carbon atoms which may be substituted; $R_2$, $R_3$, and $R_4$ are each independently a hydrogen atom, or an alkyl group having 1 to 10 carbon atoms which may be substituted or an aryl group having 6 to 40 carbon atoms which may be substituted; $R_5$ is a hydrogen atom or a hydroxy group; n represents an integer of 0 or 1; m1 represents an integer of 0 or 1; m2 represents an integer of 1; and * represents a binding site to $Z_1$.

2. The resist underlayer film-forming composition according to claim 1, wherein $Z_1$ is represented by the following Formula (3):

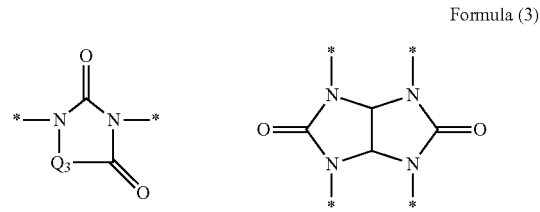

Formula (3)

in Formula (3), $Q_3$ represents the following Formula (4), Formula (5), or Formula (6):

Formula (4)

-continued

Formula (5)

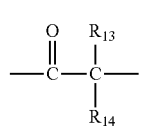

Formula (6)

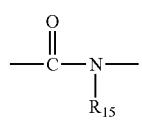

in Formula (4), Formula (5), and Formula (6), $R_{11}$, $R_{12}$, $R_{13}$, and $R_{14}$ each independently represent a hydrogen atom, an alkyl group having 1 to 10 carbon atoms which may be interrupted by an oxygen atom or a sulfur atom, an alkenyl group having 2 to 10 carbon atoms which may be interrupted by an oxygen atom or a sulfur atom, an alkynyl group having 2 to 10 carbon atoms which may be interrupted by an oxygen atom or a sulfur atom, a benzyl group, or a phenyl group, in which the phenyl group may be substituted with at least one monovalent functional group selected from the group consisting of an alkyl group having 1 to 6 carbon atoms, a halogen atom, an alkoxy group having 1 to 10 atoms, a nitro group, a cyano group, and an alkylthio group having 1 to 6 carbon atoms, $R_{15}$ represents a hydrogen atom, an alkyl group having 1 to 10 carbon atoms which may be interrupted by an oxygen atom or a sulfur atom and may be substituted with a hydroxy group, an alkenyl group having 3 to 10 carbon atoms which may be interrupted by an oxygen atom or a sulfur atom, an alkynyl group having 3 to 10 carbon atoms which may be interrupted by an oxygen atom or a sulfur atom, a benzyl group, or a phenyl group, in which the phenyl group may be substituted with at least one monovalent functional group selected from the group consisting of an alkyl group having 1 to 6 carbon atoms, a halogen atom, an alkoxy group having 1 to 10 carbon atoms, a nitro group, a cyano group, an alkylthio group having 1 to 6 carbon atoms, and a monovalent organic group represented by U in Formula (1); and * represents a binding site to U.

3. The resist underlayer film-forming composition according to claim 2, wherein $R_{15}$ is an alkyl group having 1 to 10 carbon atoms or a monovalent organic group represented by U in Formula (1).

4. The resist underlayer film-forming composition according to claim 2, wherein $R_{11}$ and $R_{12}$ are each independently an alkyl group having 1 to 10 carbon atoms.

5. The resist underlayer film-forming composition according to claim 1, wherein X is —S—, and Y is a methylene group.

6. The resist underlayer film-forming composition according to claim 1, further comprising at least one of an acid compound and a crosslinking agent.

7. The resist underlayer film-forming composition according to claim 1, further comprising a surfactant.

8. A resist underlayer film, which is a baked product of a coating film of the resist underlayer film-forming composition according to claim 1.

9. A protective film-forming composition against a semiconductor wet etching solution, comprising:

a compound represented by the following Formula (1), having a theoretical molecular weight of 999 or less, and containing two or more nitrogen atoms and six or more oxygen atoms in a molecule; and an organic solvent:

Formula (1)

in Formula (1), $Z_1$ contains a nitrogen-containing heterocyclic ring; U is a monovalent organic group represented by the following Formula (2); and p represents an integer of 2 to 4, Formula (2)

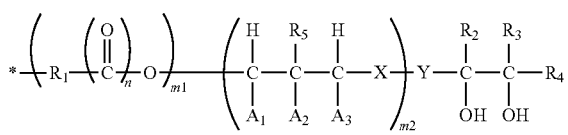

in Formula (2), $R_1$ represents an alkylene group having 1 to 4 carbon atoms; $A_1$ to $A_3$ each independently represent a hydrogen atom, a methyl group, or an ethyl group; X represents any of —COO—, —OCO—, —O—, —S—, or —NR$_a$— or —NR$_a$—, $R_a$ represents a hydrogen atom or a methyl group; Y represents a direct bond or an alkylene group having 1 to 4 carbon atoms which may be substituted; $R_2$, $R_3$, and $R_4$ are each independently a hydrogen atom, or an alkyl group having 1 to 10 carbon atoms which may be substituted or an aryl group having 6 to 40 carbon atoms which may be substituted; $R_5$ is a hydrogen atom or a hydroxy group; n represents an integer of 0 or 1; m1 represents an integer of 0 or 1; m2 represents an integer of 1; and * represents a binding site to $Z_1$.

10. The protective film-forming composition according to claim 9, wherein $Z_1$ is represented by the following Formula (3):

Formula (3)

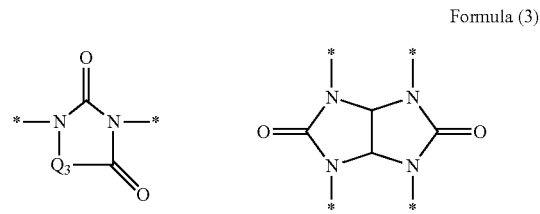

in Formula (3), $Q_3$ represents the following Formula (4), Formula (5), or Formula (6):

Formula (4)

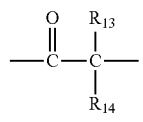

Formula (5)

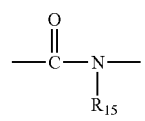

Formula (6)

in Formula (4), Formula (5), and Formula (6), $R_{11}$, $R_{12}$, $R_{13}$, and $R_{14}$ each independently represent a hydrogen atom, an alkyl group having 1 to 10 carbon atoms which may be interrupted by an oxygen atom or a sulfur atom, an alkenyl group having 2 to 10 carbon atoms which may be interrupted by an oxygen atom or a sulfur atom, an alkynyl group having 2 to 10 carbon atoms which may be interrupted by an oxygen atom or a sulfur atom, a benzyl group, or a phenyl group, in which the phenyl group may be substituted with at least one monovalent functional group selected from the group consisting of an alkyl group having 1 to 6 carbon atoms, a halogen atom, an alkoxy group having 1 to 10 carbon atoms, a nitro group, a cyano group, and an alkylthio group having 1 to 6 carbon atoms, $R_{15}$ represents a hydrogen atom, an alkyl group having 1 to 10 carbon atoms which may be interrupted by an oxygen atom or a sulfur atom and may be substituted with a hydroxy group, an alkenyl group having 3 to 10 carbon atoms which may be interrupted by an oxygen atom or a sulfur atom, an alkynyl group having 3 to 10 carbon atoms which may be interrupted by an oxygen atom or a sulfur atom, a benzyl group, or a phenyl group, in which the phenyl group may be substituted with at least one monovalent functional group selected from the group consisting of an alkyl group having 1 to 6 carbon atoms, a halogen atom, an alkoxy group having 1 to 10 carbon atoms, a nitro group, a cyano group, an alkylthio group having 1 to 6 carbon atoms, and a monovalent organic group represented by U in Formula (1); and

* represents a binding site to U.

11. The protective film-forming composition according to claim 9, further comprising at least one of an acid compound and a crosslinking agent.

12. A protective film, which is a baked product of a coating film of the protective film-forming composition according to claim 9.

13. A method for manufacturing a substrate with a resist pattern, comprising the steps of:
    applying the resist underlayer film-forming composition according to claim 1 onto a semiconductor substrate and baking the applied composition to form a resist underlayer film; and
    forming a resist film on the resist underlayer film and then performing exposure and development to form a resist pattern,
    wherein the method is used for manufacturing a semiconductor.

14. A method for manufacturing a semiconductor device, comprising the steps of:
    forming a resist underlayer film using the resist underlayer film-forming composition according to claim 1 on a semiconductor substrate optionally carrying an inorganic film formed on a surface thereof;
    forming a resist pattern on the resist underlayer film;
    dry etching the resist underlayer film using the resist pattern as a mask to expose a surface of the inorganic film or semiconductor substrate; and
    etching the inorganic film or semiconductor substrate using the dry-etched resist underlayer film as a mask.

15. A method for manufacturing a semiconductor device, comprising the steps of:
    forming a protective film using the protective film-forming composition according to claim 9 on a semiconductor substrate optionally carrying an inorganic film formed on a surface thereof;
    forming a resist pattern on the protective film;
    dry etching the protective film using the resist pattern as a mask to expose a surface of the inorganic film or semiconductor substrate; and
    wet etching and washing the inorganic film or semiconductor substrate using a semiconductor wet etching solution using the dry-etched protective film as a mask.

* * * * *